(12) United States Patent
Iwaki et al.

(10) Patent No.: US 7,814,445 B2
(45) Date of Patent: Oct. 12, 2010

(54) CIRCUIT WIRING INTERFERENCE ANALYSIS DEVICE, INTERFERENCE ANALYSIS PROGRAM, DATABASE USED IN INTERFERENCE ANALYSIS DEVICE, AND ASYMMETRICALLY CONNECTED LINE MODEL

(75) Inventors: Hideki Iwaki, Osaka (JP); Naoki Komatsu, Osaka (JP); Tetsuyoshi Ogura, Osaka (JP); Toru Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 500 days.

(21) Appl. No.: 11/911,609

(22) PCT Filed: Apr. 14, 2006

(86) PCT No.: PCT/JP2006/307969

§ 371 (c)(1),
(2), (4) Date: Oct. 15, 2007

(87) PCT Pub. No.: WO2006/112441

PCT Pub. Date: Oct. 26, 2006

(65) Prior Publication Data

US 2009/0019403 A1   Jan. 15, 2009

(30) Foreign Application Priority Data

Apr. 15, 2005   (JP)   ............................. 2005-118710

(51) Int. Cl.
*G06F 17/50*   (2006.01)

(52) U.S. Cl. ............................................. 716/4; 716/5

(58) Field of Classification Search ..................... 716/4, 716/5; 703/14
See application file for complete search history.

(56) References Cited

U.S. PATENT DOCUMENTS

| 2004/0075436 A1 | 4/2004 | Kurokawa et al. |
| 2005/0010380 A1 | 1/2005 | Yanagisawa et al. |

FOREIGN PATENT DOCUMENTS

| EP | 0 845 746 | 6/1998 |

(Continued)

OTHER PUBLICATIONS

Arz et al."Asymmetric Coupled CMOS Lines—An Experimental Study", Dec. 2000, IEEE Transactions on Microwave Theory and Technologys, vol. 48, No. 12, pp. 2409-2414.*

(Continued)

*Primary Examiner*—Sun J Lin
(74) *Attorney, Agent, or Firm*—Hamre, Schumann, Mueller & Larson, P.C.

(57) ABSTRACT

An interference analysis device that analyzes interference includes an input unit that inputs design data, a selection unit that selects an analysis region, a division unit that divides a wire into segments, a calculation unit that calculates a circuit matrix regarding a coupled line, and an analysis unit that obtains a degree of electromagnetic interference, wherein the calculation unit calculates a circuit matrix of the coupled line, using a parameter set obtained by adding an asymmetry parameter to RLGC parameters of a transmission line in the coupled line. Thus, a method for analyzing an interference of circuit wiring can be provided, which is capable of shortening a processing time substantially while maintaining high precision.

18 Claims, 21 Drawing Sheets

FOREIGN PATENT DOCUMENTS

| | | |
|---|---|---|
| JP | 10-190319 | 7/1998 |
| JP | 10-214281 | 8/1998 |
| JP | 11-296504 | 10/1999 |

OTHER PUBLICATIONS

Zhurbenko et al."Broadband Impedance Transformer Based on Asymmetric Coupled Transmission Lines in Nonhomogeneous Medium", 2007, International Microwave Symposium Digest, IEEE/MTT-S, pp. 1893-1896.*

Williams,"Multiconductor Transmission Line Characterization", May 1997, NIST, one set (17 pages).*

Tripathi, et al., "A Configuration-Oriented SPICE Model for Multiconductor Transmission Lines in an Inhomogeneous Medium", IEEE Transactions on Microwave Theory and Techniques, vol. 46, No. 12, Dec. 1998, pp. 1997-2005, XP011037442, ISSN: 0018-9480.

Quéré, et al., "Interconnect Mode Conversion in High-speed VLSI Circuits", Quality Electronic Design, 2004, Proceedings. 5th International Sympos IUM on San Jose, California, Mar. 22-24, 2004, Piscataway, NJ, USA, IEEE, Mar. 22, 2004, pp. 265-270, XP010695503, ISBN: 978-0-7695-2093-3.

Banwell, et al., "A Novel Approach to the Modeling of the Indoor Power Line Channel Part I: Circuit Analysis and Companion Model", IEEE Transactions on Power Delivery, IEEE Service Center, New York NW, US, vol. 20, No. 2, Apr. 2005, pp. 655-663, XP011129366, ISSN: 0885-8977.

Gupta, et al., "Microstrip Lines and Slotlines (Artech House Antennas and Propagation Library)", Artech House Publishers, Mar. 1, 1996, pp. 457-469.

* cited by examiner (a)

(b)

(a)

———— Line of electric force
— — — — — Line of magnetic force

Even mode (b)

———— Line of electric force
— — — — — Line of magnetic force

Odd mode (a)

(b) Equivalent model in a case of symmetric wiring (c) Equivalent model in a case of asymmetric wiring (a)

Even mode (b)

Odd mode (c)

Mixed mode (a)

1000

(b)

2000

CIRCUIT WIRING INTERFERENCE ANALYSIS DEVICE, INTERFERENCE ANALYSIS PROGRAM, DATABASE USED IN INTERFERENCE ANALYSIS DEVICE, AND ASYMMETRICALLY CONNECTED LINE MODEL

TECHNICAL FIELD

The present invention relates to an interference analysis device for analyzing the interference between wires provided on a circuit board, an interference analysis program, a database used in an interference analysis device, and an asymmetric coupled line model.

BACKGROUND ART

Recently, a printed board (wiring board) mostly is designed with a CAD (Computer Aided Design) for printed board design using a computer (see, for example, Patent Document 1). In the design of a printed board using the CAD, while there are a number of portions that are automated, there also are portions that cannot be designed appropriately without a skilled designer.

Particularly, in printed board design of a high-frequency circuit, the interference between wires has a large influence on transmission characteristics. In order to predict this influence in the design stage, it is necessary to obtain the interference amount between wires by complicated calculation based on an electromagnetic analysis. However, in complicated wiring design including an asymmetric coupled line, it is difficult to obtain the interference amount between wires by calculation, and there are a number of cases where the interference amount actually cannot be calculated. Therefore, the interference amount between wires mostly is considered by so-called guesswork by a skilled designer, instead of an electromagnetic analysis. Furthermore, the fact is that a printed board is developed by trial and error without considering the interference amount between wires.

The case where the interference amount between wires is obtained by a conventional electromagnetic analysis will be described. FIG. 24(*a*) is a diagram showing an example of a wiring pattern in one of inner layers included in a multi-layered board. In the case where wires to be analyzed have, for example, a wiring pattern 1000 (i.e., a complicated wiring pattern to be used actually) shown in FIG. 24(*a*), the wiring pattern 1000 cannot be subjected to an electromagnetic analysis as it is. Thus, the overall wiring pattern 1000 is divided into a mesh shape as in a wiring pattern 2000 shown in FIG. 24(*b*). An analysis model in each divided cell is subjected to an electromagnetic analysis. Next, the interaction between the respective cells is calculated, whereby the overall electromagnetic analysis is completed. The interference amount between wires is obtained from the results of the overall electromagnetic analysis.

However, in the case where the wires to be analyzed have the complicated wiring pattern 1000 as shown in FIG. 24(*a*), the number of divided cells is enormous as shown in FIG. 24(*b*), and consequently, a great amount of calculation time may be required. Thus, there are a number of cases where an electromagnetic analysis may not be completed within an actual working time. Particularly, in the case of a most-advanced printed board, an electromagnetic analysis may not be completed in all the cases.

For example, according to the study by the inventors of the present application, in the case where a printed board to be analyzed is a multi-layered board of 8 layers, having a size of 40 mm×40 mm, the number of nets (the number of wires connecting components) included in the printed board is 550, and the number of vias electrically connecting layers is 5000, the following results are predicted.

More specifically, in the case of performing an electromagnetic analysis method based on a moment method using a Pentium (Registered Trademark) 4 processor with a 3 GHz operation and a 2 G-byte memory for a CPU, with respect to 20 frequency points, it was predicted that the physical memory amount to be required exceeds the memory amount of a computer. Therefore, under the above conditions, it was inferred that an analysis cannot be performed. Even if the limit of a memory amount can be solved, it was predicted that at least 500 hours are required in order to perform an analysis.

Furthermore, as the number of frequency points increases, a processing time or a processing data amount increases. In addition, an electromagnetic analysis needs to be performed every time a printed board is improved, instead of only once. Therefore, it is actually very difficult to obtain the interference amount between wires by an electromagnetic analysis, aside from a printed board with a very simple configuration.

In order to enhance an electromagnetic analysis method, an electromagnetic analysis method by the combination of a finite element method and a boundary element method has been disclosed (see, for example, Patent Document 2).

Patent Document 1: JP 10-214281 A
Patent Document 2: JP 11-296504 A

DISCLOSURE OF INVENTION

Problem to be Solved by the Invention

However, in order to perform the above-mentioned electromagnetic analysis, it is necessary to calculate the characteristics of a structure (e.g., a wiring board) every time the analysis is performed. Thus, even if the calculation amount is reduced to some degree, the calculation amount is still enormous similarly even in the electromagnetic analysis described in the above-mentioned Patent Document 2. Consequently, the calculation time becomes very long. On the other hand, using an electromagnetic analysis method in which a processing time is shortened, the precision is poor, and only useless interference analysis results are obtained.

If the wiring interference of a complicated wiring pattern is investigated using an electromagnetic analysis as described above, an enormous processing time is required. In order to solve this problem, the inventors of the present application earnestly studied the problem repeatedly, with the aim of solving the problem with an original procedure different from a procedure as an extension of a conventional technique of attempting to shorten the analysis time by degrading the precision of analysis results, thereby minimizing the degradation in precision.

More specifically, the object of the present invention is to provide an interference analysis device capable of shortening a processing time significantly while maintaining high precision.

Means for Solving Problem

An interference analysis device according to the present invention, which analyzes the interference between wires provided on a circuit board and including a coupled line, includes: an input unit that inputs design data representing an arrangement of the wires on the circuit board; a selection unit that selects, as an analysis region, at least a part of the circuit board represented by the design data; a division unit that divides the wires in the analysis region into segments to be units for calculating a circuit matrix; a calculation unit that calculates a circuit matrix with respect to a coupled line constituted by two segments adjacent to each other in parallel among the segments divided by the division unit, or a single segment; and an analysis unit that obtains a degree of electromagnetic interference between the wires in the analysis region based on the circuit matrix, wherein the calculation unit calculates the circuit matrix of the coupled line, using a parameter set obtained by adding an asymmetry parameter representing asymmetry of the coupled line to RLGC parameters containing a resistance (R), an inductance (L), a parallel conductance (G), and a capacitance (C) of a transmission line in the coupled line.

The data stored on a recording medium according to the present invention is used in processing for a computer to obtain a circuit matrix of a coupled line, and contains a parameter set obtained by adding an asymmetry parameter representing asymmetry of the coupled line to RLGC parameters containing a resistance (R), an inductance (L), a parallel conductance (G), and a capacitance (C) of a transmission line in the coupled line An asymmetric coupled line model according to the present invention is used in processing for a computer to calculate a circuit matrix in an asymmetric coupled line included in wires provided on a circuit, includes a parameter set obtained by adding an asymmetry parameter representing asymmetry of the coupled line to RLGC parameters containing a resistance (R), an inductance (L), a parallel conductance (G), and a capacitance (C) per unit length of a transmission line in the coupled line on the circuit, wherein circuit characteristics of the coupled line are represented as data readable by a computer, using the parameter set.

An interference analysis program according to the present invention causes a computer to execute processing of analyzing interference between wires provided on a circuit board and including a coupled line, the program causing the computer to execute: input processing of inputting design data that represents an arrangement of wires in the circuit board; selection processing of selecting, as an analysis region, at least a part of the circuit board represented by the design data; division processing of dividing the wires in the analysis region into segments to be units for calculating a circuit matrix; calculation processing of calculating a circuit matrix, regarding a coupled line constituted by two segments adjacent to each other in parallel among the segments divided by the division processing, or a single segment; and analysis processing of obtaining a degree of electromagnetic interference between the wires in the analysis region based on the circuit matrix, wherein the calculation processing calculates a circuit matrix of the coupled line, using a parameter set obtained by adding an asymmetry parameter representing asymmetry of the coupled line to RLGC parameters containing a resistance (R), an inductance (L), a parallel conductance (G), and a capacitance (C) of a transmission line in the coupled line.

EFFECTS OF THE INVENTION

According to the present invention, an interference analysis device capable of shortening a processing time significantly while maintaining high precision can be realized.

DESCRIPTION OF THE REFERENCE NUMERALS

Figure 1:
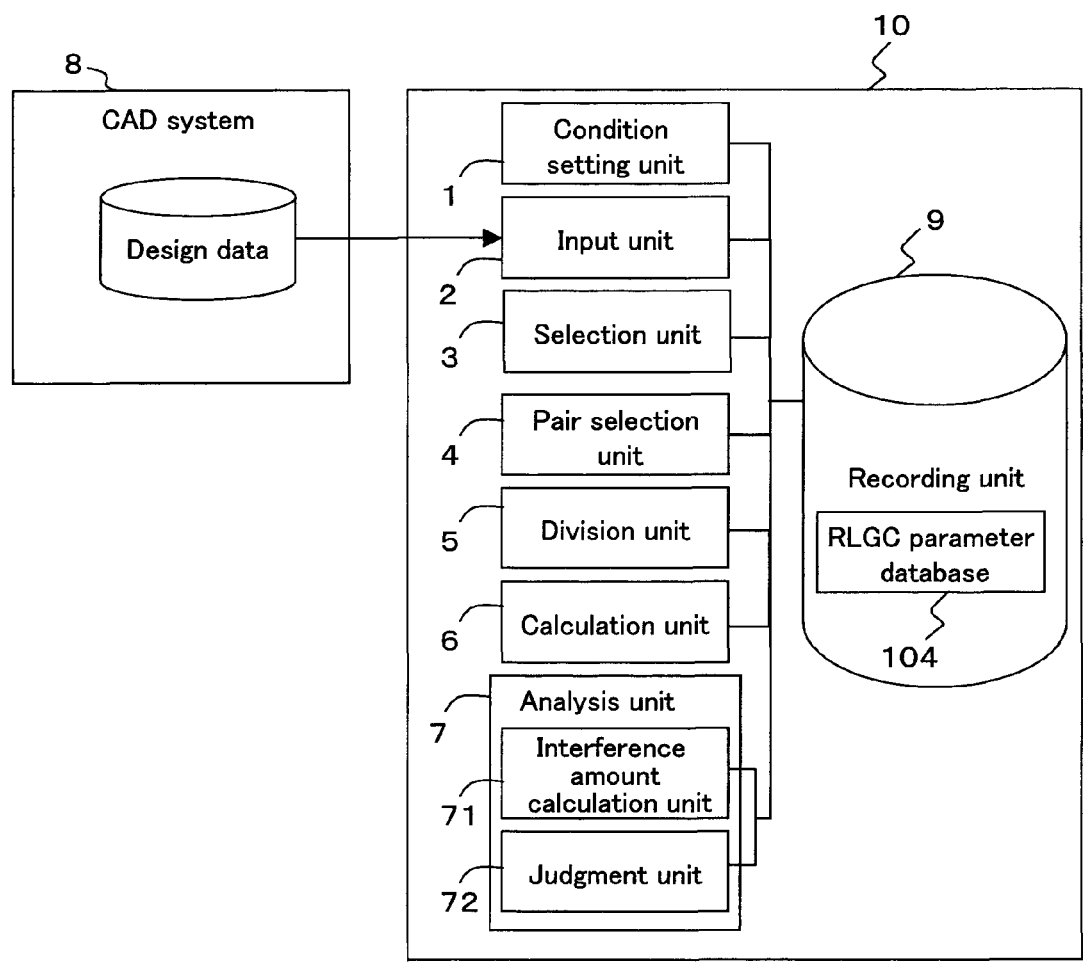
FIG. 1 is a functional block diagram showing an exemplary configuration of an interference analysis device.

1 Condition setting unit
2 Input unit
3 Selection unit
4 Pair selection unit
5 Division unit
6 Calculation unit 7 Analysis unit
8 CAD
9 Recording unit
11, 21 First line
12, 22 Second line
15 Substrate
30 Wire to be analyzed
30a Wire segment
32 Ground
35 Coupled line
71 Interference amount calculation unit
72 Judgment unit
101 CPU
102 ROM
103 RAM
104 RLGC parameter database
105 Input device
106 Printing device
107 Display device
108 External storage device
110 Interference analysis device
550 RLGC parameter data
550' S parameter data
800, 900, 950 Coupled line
1000 Wiring pattern
2000 Wiring pattern

DESCRIPTION OF THE INVENTION

An interference analysis device according to the present invention, which analyzes interference between wires provided on a circuit board and including a coupled line, includes: an input unit that inputs design data representing an arrangement of the wires on the circuit board; a selection unit that selects, as an analysis region, at least a part of the circuit board represented by the design data; a division unit that divides the wires in the analysis region into segments to be units for calculating a circuit matrix; a calculation unit that calculates a circuit matrix with respect to a coupled line constituted by two segments adjacent to each other among the segments divided by the division unit, or a single segment; and an analysis unit that obtains a degree of electromagnetic interference between the wires in the analysis region based on the circuit matrix, wherein the calculation unit calculates the circuit matrix of the coupled line, using a parameter set obtained by adding an asymmetry parameter representing asymmetry of the coupled line to RLGC parameters containing a resistance (R), an inductance (L), a parallel conductance (G), and a capacitance (C) of a transmission line in the coupled line.

The calculation unit calculates a circuit matrix of the coupled line, using a parameter set obtained by adding an asymmetry parameter representing asymmetry of the coupled line to RLGC parameters containing a resistance (R), an inductance (L), a parallel conductance (G), and a capacitance (C) of a transmission line in the coupled line, so that even an asymmetric coupled line can be processed in a similar manner to that of a symmetric coupled line. Therefore, a circuit matrix can be obtained within a short processing time. The analysis unit obtains a degree of electromagnetic interference between wires based on the circuit matrix, so that a processing time can be shortened substantially while high precision is maintained.

Herein, the wires adjacent to each other are not limited to parallel wires.

In the interference analysis device according to the present invention, it is preferable that the asymmetry parameter interpolates asymmetry of an asymmetric coupled line to enable the asymmetric coupled line to be dealt with as a symmetric coupled line.

The calculation unit obtains a circuit matrix, using the asymmetric parameter, so that a processing time for obtaining a circuit matrix can be shortened substantially.

In the interference analysis device according to the present invention, it is preferable that the asymmetry parameter is used for rotating the circuit matrix mathematically so that an odd mode and an even mode have a symmetric relationship of 1:1 in an asymmetric coupled line.

The asymmetry parameter is used for rotating the circuit matrix mathematically so that an odd mode and an even mode have a symmetric relationship of 1:1 in an asymmetric coupled line. Therefore, the calculation unit can deal with an asymmetric coupled line in a similar manner to that of a symmetric coupled line by using the asymmetry parameter.

In the interference analysis device according to the present invention, the asymmetry parameter may be calculated using an impedance in a case where a line included in the coupled line is present alone. Consequently, an asymmetry parameter can be expressed approximately with each impedance of lines included in a coupled line.

In the interference analysis device according to the present invention, the asymmetry parameter P can be calculated by the following Expression (1) in a coupled line constituted by a first line and a second line:

$$P = (\text{impedance in a case where the first line is present alone/impedance in a case where the second line is present alone})^{1/2} \quad (1).$$

Herein, the case where the first line or the second line is present alone means the case where the first line and the second line are spaced away from each other sufficiently so as not to influence each other.

Furthermore, asymmetry parameters P1, P2, and P3 in a coupled line constituted by a first line, a second line, and a third line and having a configuration in which a distance between the first line and the third line is larger than a distance between the other sets of two lines may be calculated by the following Expressions (1-a), (1-b), and (1-c), respectively, and the calculation unit may calculate a circuit matrix of the coupled line, using P1, P2, and P3 as asymmetry parameters:

$$P1 = (\text{impedance in an even mode between the first line and the second line/impedance in an even mode between the third line and the second line})^{1/2} \quad (\text{Expression 1-a})$$

$$P2 = (\text{impedance of the first line in a case where the second line is grounded/impedance of the third line in a case where the second line is grounded})^{1/2} \quad (\text{Expression 1-b})$$

$$P3 = (\text{impedance in an odd mode between the first line and the second line/impedance in an odd mode between the third line and the second line})^{1/2} \quad (\text{Expression 1-c}).$$

In the interference analysis device according to the present invention, it is preferable that the division unit divides two wires, that are present in the analysis region so as to be adjacent to each other, in such a manner that a position that is a boundary between a portion where the two wires are arranged in parallel and a portion where the two wires are not arranged in parallel is included in a boundary of the segments.

The above-mentioned division unit divides wires so that the number of segments arranged in parallel to each other is larger. Therefore, a number of line segments constituted by segments arranged in parallel to each other are present. A circuit matrix of a coupled line constituted by segments arranged in parallel to each other is calculated with a small amount of processing. Consequently, the processing time in the calculation unit is shortened.

In the interference analysis device according to the present invention, the circuit matrix may be an S matrix.

The interference analysis device according to the present invention further includes a recording unit storing a plurality of parameter sets obtained respectively by adding an asymmetry parameter representing asymmetry of the coupled line to RLGC parameters containing a resistance (R), an inductance (L), a parallel conductance (G), and a capacitance (C) of a transmission line in the coupled line, wherein, in the recording unit, the parameter sets are recorded so as to be associated with line information representing configurations of coupled lines regarding the parameter sets, and regarding a coupled line in the analysis region, the calculation unit searches the recording unit for line information matched with the configuration of the coupled line, and calculates a circuit matrix of the coupled line, using a parameter set corresponding to the line information obtained as a result of the search.

The calculation unit obtains the parameter set from the recording unit, so that it is not necessary to obtain a parameter set by calculation. Consequently, a processing time is shortened.

In the interference analysis device according to the present invention, in a case where the calculation unit is not capable of obtaining the corresponding parameter set as a result of the search, the calculation unit performs interpolation using a parameter set of line information close to a configuration of the coupled line regarding the search, thereby obtaining a parameter set in the coupled line.

Even in the case where the corresponding parameter set is not present in the recording unit, the calculation unit can obtain a parameter set by interpolation. Therefore, the number of parameter sets to be recorded in the recording unit may be small. Consequently, the above-mentioned search can be conducted quickly.

In the interference analysis device according to the present invention, it is preferable that the calculation unit calculates a circuit matrix of the coupled line regarding a plurality of different frequencies, using a parameter set obtained by adding an asymmetry parameter representing asymmetry of the coupled line to RLGC parameters containing a resistance (R), an inductance (L), a parallel conductance (G), and a capacitance (C) of a transmission line in the coupled line.

The calculation unit calculates a circuit matrix of the coupled line regarding a plurality of different frequencies, so that the analysis unit can obtain a degree of interference between wires at any frequency.

The interference analysis device according to the present invention further includes: a condition setting unit that sets an interference analysis condition containing an interference amount reference value; a pair selection unit that selects a pair of wires to be analyzed among wires in the analysis region; an interference amount calculation unit that calculates an interference amount between the pair of wires based on a connection condition representing a connection relationship between segments included in the pair of wires and the circuit matrix calculated in the calculation unit; and a judgment unit that judges whether or not interference between the pair of wires causes a problem, comparing the interference amount reference value with the interference amount.

The interference amount calculation unit calculates an interference amount between the pair of wires selected by the pair selection unit, so that the judgment unit can judge whether or not interference between the pair of wires causes a problem. Consequently, a pair of wires, that cause a problem, are extracted.

Data according to the present invention, allowing a computer to be used in processing of obtaining a circuit matrix of a coupled line having various configurations, contains a parameter set obtained by adding an asymmetry parameter representing asymmetry of the coupled line to RLGC parameters containing a resistance (R), an inductance (L), a parallel conductance (G), and a capacitance (C) of a transmission line in the coupled line, and line information representing a configuration of the coupled line, associated with the parameter set.

Using a parameter set contained in the data and line information associated with the parameter set, a circuit matrix in a coupled line having a configuration represented by the line information can be obtained by a computer. The parameter set contains an asymmetry parameter representing the asymmetry of the coupled line. Therefore, even if the coupled line represented by the line information is an asymmetric coupled line, the computer can process the asymmetric coupled line in a similar manner to that of a symmetric coupled line.

An asymmetric coupled line model according to the present invention, causing a computer to be used in processing of calculating a circuit matrix in an asymmetric coupled line included in wires provided on a circuit, includes a parameter set obtained by adding an asymmetry parameter representing asymmetry of the coupled line to RLGC parameters containing a resistance (R), an inductance (L), a parallel conductance (G), and a capacitance (C) per unit length of a transmission line in the coupled line on the circuit, wherein circuit characteristics of the coupled line are represented as data readable by a computer, using the parameter set.

The asymmetric coupled line calculates a circuit matrix in a coupled line using a parameter set including the asymmetric parameter, so that the circuit matrix in any coupled line can be calculated with a small amount of processing.

An interference analysis program according to the present invention causes a computer to execute processing of analyzing interference between wires provided on a circuit board and including a coupled line, the program causing the computer to execute: input processing of inputting design data that represents an arrangement of wires in the circuit board; selection processing of selecting, as an analysis region, at least a part of the circuit board represented by the design data; division processing of dividing the wires in the analysis region into segments to be units for calculating a circuit matrix; calculation processing of calculating a circuit matrix, regarding a coupled line constituted by two segments adjacent to each other among the segments divided by the division processing, or a single segment; and analysis processing of obtaining a degree of electromagnetic interference between the wires in the analysis region based on the circuit matrix, wherein the calculation processing calculates a circuit matrix of the coupled line, using a parameter set obtained by adding an asymmetry parameter representing asymmetry of the coupled line to RLGC parameters containing a resistance (R), an inductance (L), a parallel conductance (G), and a capacitance (C) of a transmission line in the coupled line.

In the interference analysis program according to the present invention, the asymmetry parameter interpolates asymmetry of an asymmetric coupled line to enable the asymmetric coupled line to be dealt with as a symmetric coupled line.

In the interference analysis program according to the present invention, it is preferable that the asymmetry parameter is used for rotating the circuit matrix mathematically so that an odd mode and an even mode have a 1:1 symmetric relationship in the asymmetric coupled line.

In the interference analysis program according to the present invention, it is preferable that the asymmetry parameter P is calculated by the above Expression (1) in a coupled line constituted by a first line and a second line.

Hereinafter, embodiments of the present invention will be described with reference to the drawings. In the following drawings, for simplicity of the description, components having substantially the same functions are denoted with the same reference numerals. The present invention is not limited to the following embodiments.

EMBODIMENT 1

The present embodiment relates to an interference analysis device that analyzes the interference between wires provided on a circuit board.

FIG. 1 is a functional block diagram showing an exemplary configuration of an interference analysis device according to the present embodiment.

As shown in FIG. 1, an interference analysis device 10 includes a condition setting unit 1, an input unit 2, a selection unit 3, a pair selection unit 4, a division unit 5, a calculation unit 6, an analysis unit 7, and a recording unit 9. The analysis unit 7 includes an interference amount calculation unit 71 and a judgment unit 72. The recording unit 9 is provided with an RLGC parameter database 104. The RLGC parameter database 104 previously stores an RLGC parameter and an asymmetry parameter in any coupled line. The RLGC parameter and the asymmetry parameter will be described later.

Furthermore, the interference analysis device 10 is connected to a CAD 8. The CAD 8 stores design data on a circuit board to be subjected to an interference analysis.

The condition setting unit 1 sets conditions of an analysis performed by the interference analysis device 10. For example, the condition setting unit 1 receives an input of analysis conditions from a designer via an input device such as a keyboard or a mouse. The analysis conditions set in the condition setting unit 1 are stored in the recording unit 9.

The input unit 2 reads the design data on the circuit board stored in the CAD 8, and sets the design data to be available in the interference analysis device 10.

The selection unit 3 selects at least a part of the circuit board represented by the design data read by the input unit 2 as an analysis region.

The pair selection unit 4 further selects a pair of wires from those included in the analysis region selected by the selection unit 3.

The division unit 5 divides the pair of wires selected by the pair selection unit 4 into segments.

The calculation unit 6 calculates a circuit matrix for each segment divided by the division unit 5. The design data input in the input unit 2, and various parameters stored in the RLGC parameter database are used for calculating a circuit matrix.

The interference amount calculation unit 71 calculates an interference degree in the pair of wires based on the circuit matrix calculated for each segment.

The judgment unit 72 judges whether or not the interference in the pair of wires causes a problem, based on the conditions set in the condition setting unit 1, and the calculation results in the interference amount calculation unit 71.

Figure 2:
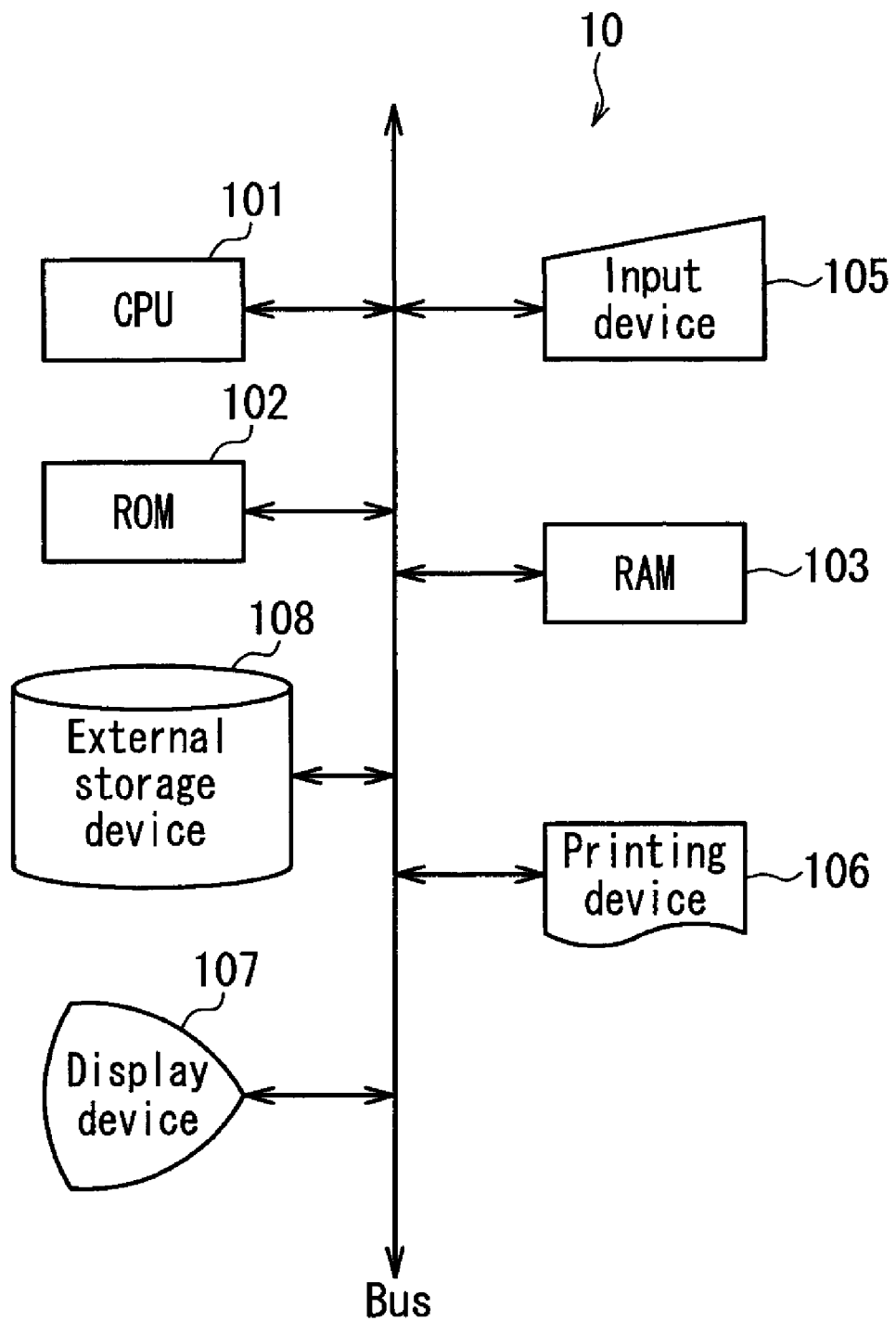
FIG. 2 is a diagram showing an exemplary hardware configuration of an interference analysis device 10.

FIG. 2 is a diagram showing an exemplary hardware configuration of the interference analysis device 10. As shown in FIG. 2, the interference analysis device 10 is composed of a CPU (central processing unit) 101 performing an arithmetic operation, a ROM 102 storing a program and the like, a RAM 103 to be a working region or the like of the CPU, an external storage device 108 (e.g., a hard disk, a flash memory, a DVD, etc.) storing various set data and the like, an input device 105 (e.g., a keyboard, a mouse, etc.) receiving an input by an operator, a printing device 106 (e.g., a printer), and a display device 107 (a liquid crystal display, a CRT, etc.). Each element is connected via a bus. The functions of the condition setting unit 1, the input unit 2, the selection unit 3, the pair selection unit 4, the division unit 5, the calculation unit 6, and the analysis unit 7 in FIG. 1 are realized when the CPU 101 executes a predetermined program stored, for example, in the ROM 102. As the recording unit 9, the external storage device 108 can be used.

The interference analysis device 10 also can be configured by incorporating a program for realizing the functions of the condition setting unit 1, the input unit 2, the selection unit 3, the pair selection unit 4, the division unit 5, the calculation unit 6, and the analysis unit 7 in a general computer. The program can be recorded on a computer-readable recording medium (e.g., an optical recording medium, a magnetic recording medium, a magnetooptical recording medium, a flash memory, etc.). Furthermore, the interference analysis device 10 also can be configured on the same computer as that of the CAD 8. Thus, the operation of the CAD 8 and that of the interference analysis device 10 can be executed by one device. Furthermore, the interference analysis device 10 executes a simulation of circuit wiring, so that the interference analysis device 10 also can be referred to as a circuit simulator in this sense.

The hardware configuration of the interference analysis device 10 is not limited to the one shown in FIG. 2. For example, the function of the interference analysis device 10 may be distributed in a plurality of PCs or the like connected so as to communicate with each other through the Internet, LAN, or the like.

Figure 3:
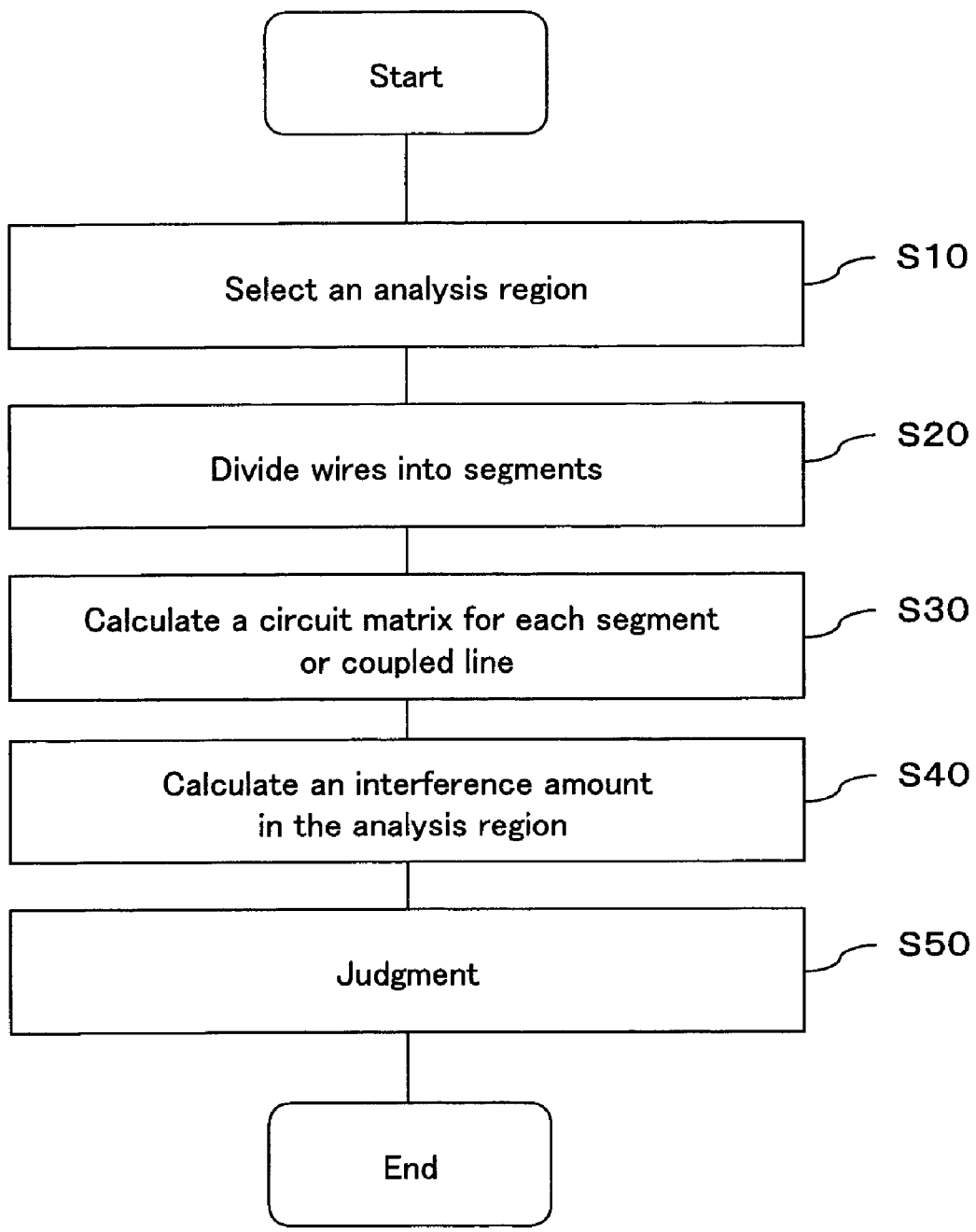
FIG. 3 is a flowchart showing a basic flow of interference analysis processing performed by the interference analysis device 10.

Next, the operation of the interference analysis processing performed by the interference analysis device 10 will be described. FIG. 3 is a flowchart showing a basic flow of the interference analysis processing performed by the interference analysis device 10.

First, the selection unit 3 selects at least a part of a region including an asymmetric coupled line as an analysis region (Step S10). FIG. 4(a) is a diagram showing an example of the analysis region selected by the selection unit 3. An analysis region 500 shown in FIG. 4(a) includes wires 201, 202, 203, and 204.

Next, the division unit 5 divides the wires 201, 202, 203, and 204 in the analysis region 500 into segments (Step S20). FIG. 4(b) is a diagram showing an example of segment division. For example, the wire 204 is divided into 8 segments including segments 30a, 30b. Each segment is a small region to be a unit for calculating a circuit matrix.

A portion in which segments are adjacent to each other is set to be a coupled line. The coupled line refers to a pair of lines between which electromagnetic coupling is present to such a degree as not to be negligible. For example, in FIG. 4(b), the segments 30a and 30e adjacent to each other in parallel are set to be a coupled line 35. Furthermore, not only lines provided on the same wiring layer, but also lines provided on different wiring layers are dealt with as coupled lines. Furthermore, segments constituting a coupled line are not necessarily parallel to each other. The detail of segment division will be described later.

The calculation unit 6 calculates a circuit matrix (e.g., an S matrix) with respect to the segments divided in Step S20, or the coupled line constituted by the segments (Step S30). The calculation unit 6 obtains, for example, an S matrix of the coupled line 35. The S matrix of the coupled line 35 is an S matrix of four terminals. S matrices are obtained with respect to all the coupled lines in the analysis region 500.

The S matrix (scattering matrix) defines characteristics of a circuit by the magnitude and phase of a wave related to the electric power that is input/output with respect to each terminal pair (port) of the circuit. Each element of the S matrix is called an S parameter.

In Step S30, the calculation unit 6 obtains an S matrix, using an RLGC parameter composed of a resistance (R), an inductance (L), a parallel conductance (G), and a capacitance (C) per unit length of a transmission line in the coupled line, with an asymmetry parameter (hereinafter, referred to as an ASP) added thereto. More specifically, the calculation unit 6 calculates S parameters using the RLGC parameter and the ASP.

The ASP is a parameter that interpolates the asymmetry of an asymmetric coupled line to enable the asymmetric coupled line to be dealt with as a symmetric coupled line. Thus, the calculation unit 6 can calculate S parameters of an asymmetric coupled line by using the ASP. Therefore, the interference analysis device 10 is suitable for analyzing a wiring pattern having an asymmetric coupled line to be used actually, rather than being used for analyzing a wiring pattern such as a test pattern composed of only a symmetric shape. The detail of the ASP will be described later.

The interference amount calculation unit 71 calculates an interference amount between wires in the analysis region 500 based on the S matrix calculated by the calculation unit 6 (Step S40).

The judgment unit 72 judges whether or not the interference between wires in the analysis region 500 causes a problem. The judgment unit 72 performs judgment, for example, by judging whether or not the interference amount calculated in Step S40 exceeds a previously set reference value.

Figure 4:
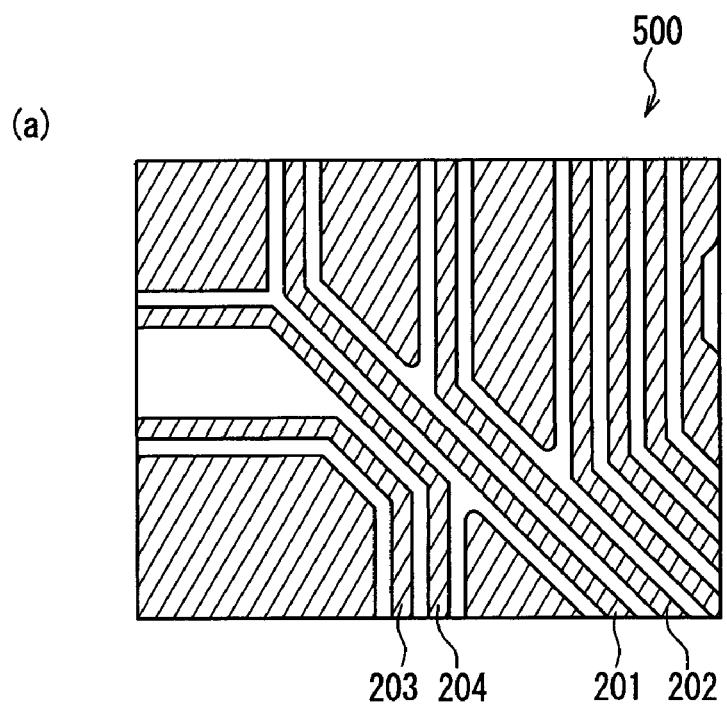
FIG. 4($a$) is a diagram showing an example of a selected analysis region. ($b$) is a diagram showing an example of segment division.
Figure 4:
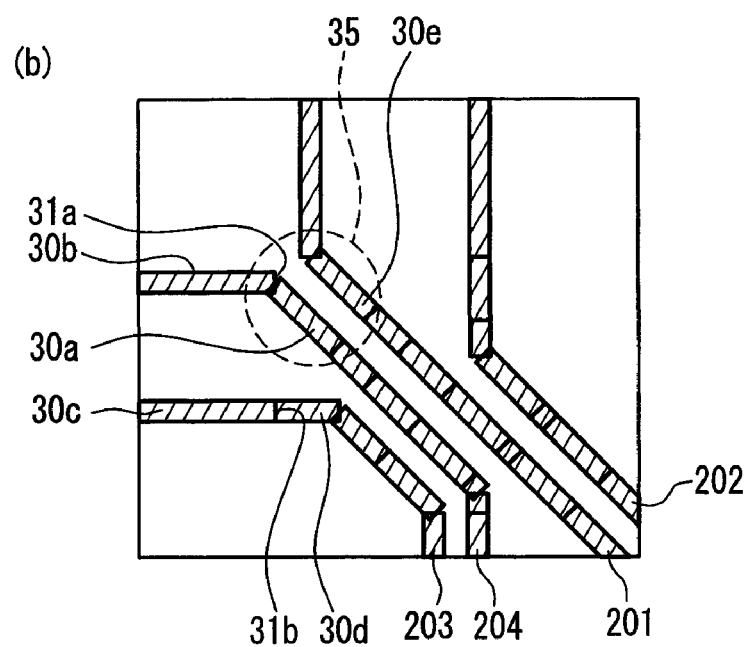
Figure 24:
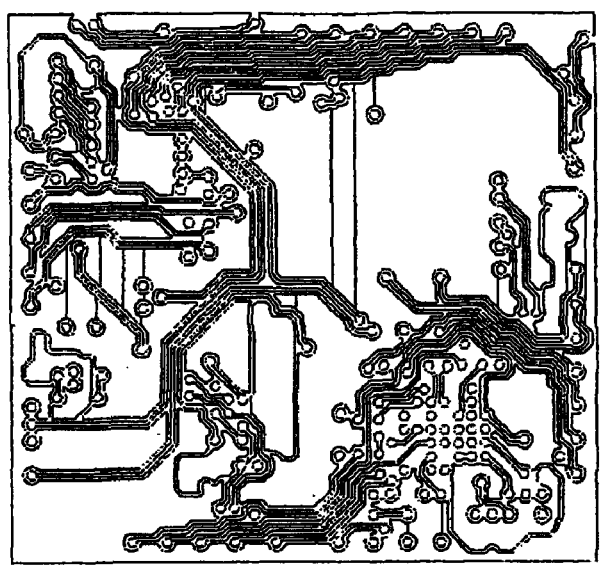
FIG. 24($a$) is a diagram showing an exemplary wiring pattern in one of inner layers included in a multi-layered board. ($b$) is a diagram showing an example in which the board is divided into a mesh shape.
Figure 24:
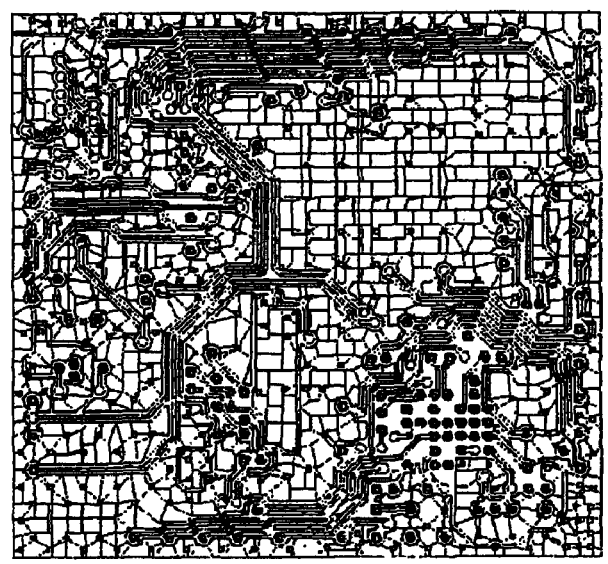

As described above, in the processing of the interference analysis device 10, the circuit board to be analyzed is not divided into a mesh shape as a whole as in the conventional method shown in FIG. 24(*b*), and only the wires are divided into segments as shown in FIG. 4(*b*). A coupled line constituted by a pair of segments is represented by an S matrix. More specifically, the coupled line is replaced by an equivalent model. Interference (electromagnetic interference) is obtained based on the equivalent model.

Figure 5:
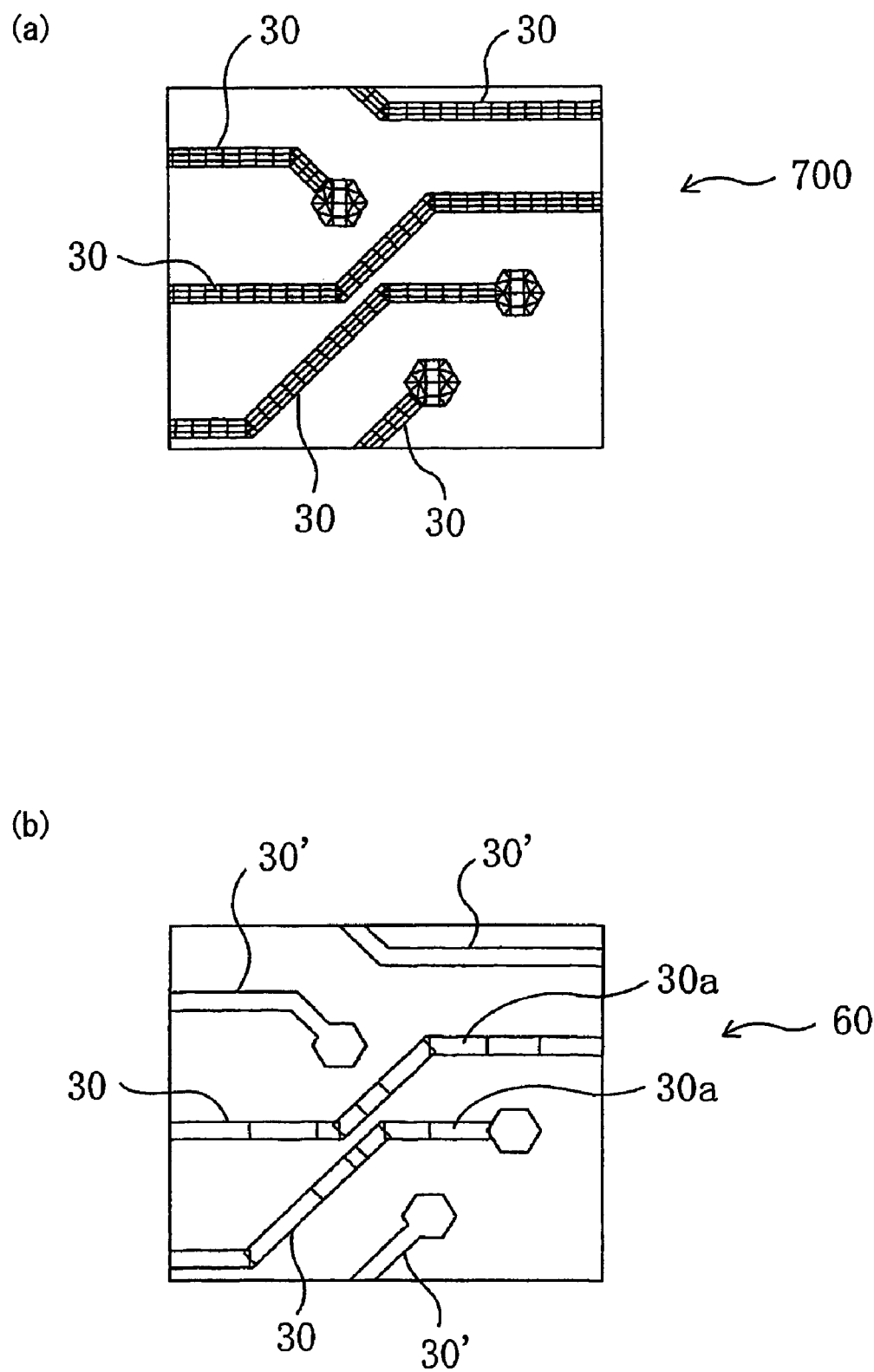
FIG. 5($a$) is a diagram showing an exemplary case where wires are divided into a mesh shape. ($b$) is a diagram showing an exemplary case where wires are divided into segments.

On the other hand, according to the conventional procedure, as shown in FIG. 5(*a*), wires 30 are divided into a mesh shape, and an electric magnetic analysis is performed for each of a plurality of divided pieces. Therefore, a great amount of processing time is required.

In contrast, according to the interference analysis processing in the present embodiment, as shown in FIG. 5(*b*), the wires 30 to be analyzed are extracted, and the wires 30 are divided into a plurality of segments including segments 30*a*. Therefore, a processing time is shortened substantially.

Hereinafter, the detail of a calculation method for obtaining an S matrix of a coupled line in Step S30 will be described. The case where a coupled line is symmetrical and the case where a coupled line is asymmetrical will be described with reference to FIGS. 6 to 11.

First, the case of a symmetric coupled line will be described. The symmetric coupled line refers to a coupled line in which two lines constituting the coupled line have the same shape and the same electrical property, and the two lines and surrounding configurations are placed at positions symmetrical with respect to a symmetric surface. Herein, the surrounding configurations include, for example, the positional relationship between a line and a ground, the configuration and electrical property of a dielectric provided between the line and the ground, and the like.

Figure 6:
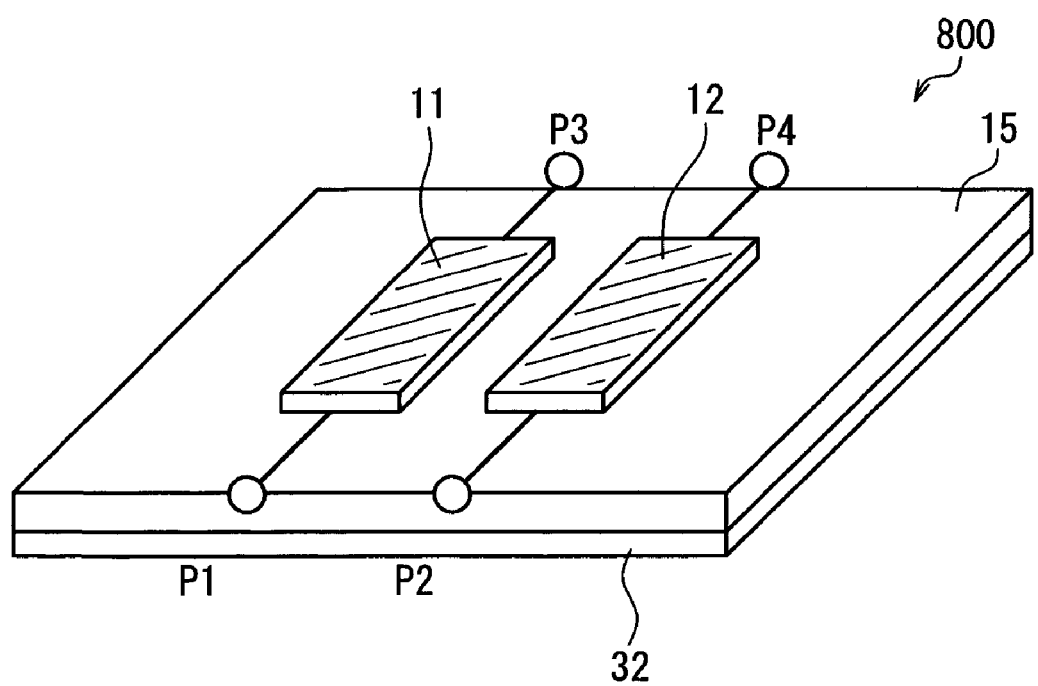
FIG. 6 is a diagram showing a configuration of a coupled line 800 in the case where the coupled line is symmetrical.
Figure 7:
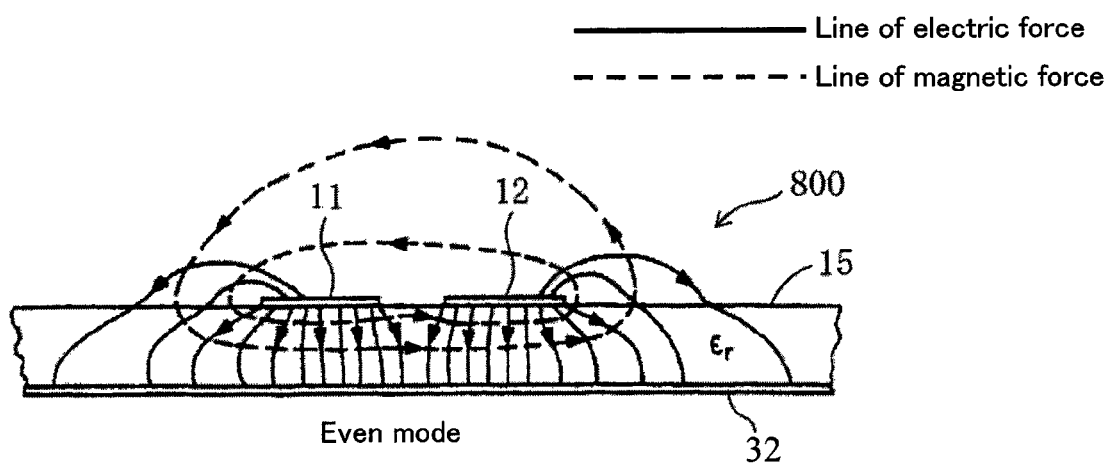
FIG. 7($a$) is a diagram showing the state of an electric field and a magnetic field in an even mode. ($b$) is a diagram showing the state of an electric field and a magnetic field in an odd mode.
Figure 7:
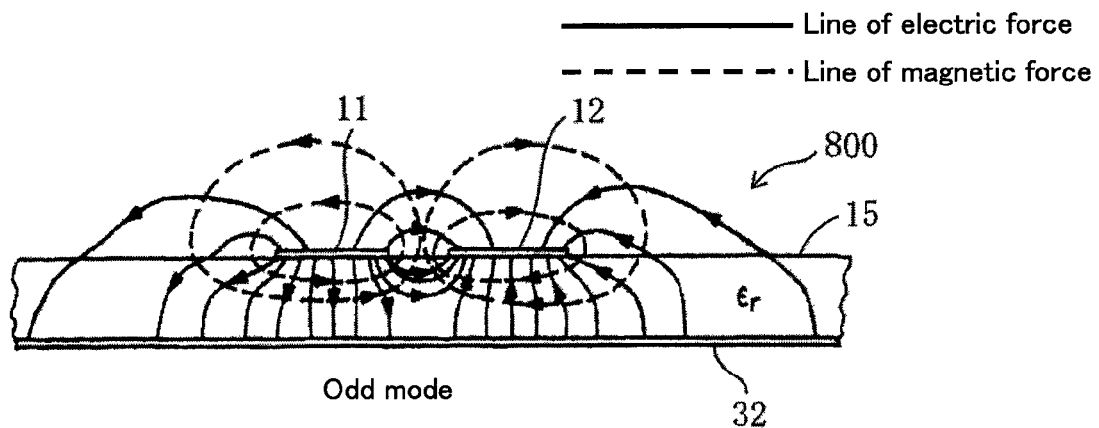

FIG. 6 is a diagram showing a configuration of the coupled line 800 in the case where the coupled line is symmetrical. As shown in FIG. 6, the coupled line 800 is constituted by a first line 11 and a second line 12. the first line 11 and the second line 12 are placed on a substrate 15 in a symmetric configuration. On a lower surface of the substrate 15, a ground 32 is provided. The first line 11 has ports P1 and P3, and the second line 12 has ports P2 and P4.

Herein, the S matrix of the coupled line 800 shown in FIG. 6 is represented by the following Expression 1.

$$S = \begin{bmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{bmatrix}$$

$$= \begin{bmatrix} S_{11} & S_{12} & S_{13} & S_{14} \\ S_{12} & S_{11} & S_{14} & S_{13} \\ S_{13} & S_{14} & S_{11} & S_{12} \\ S_{14} & S_{13} & S_{12} & S_{11} \end{bmatrix}$$

[Expression 1]

The coupled line 800 has a symmetric configuration, so that some of the elements in the S matrix of the coupled line 800 can be expressed by the same S parameters. For example, in the S parameters shown in the above Expression 1, S11=S22=S33=S44, S12=S21=S43=S34, S13=S31=S42=S24. Thus, if 4 kinds of S parameters: S11, S12, S13, and S14 are obtained, an S matrix can be obtained. Herein, 4 kinds of S parameters: S11, S12, S13, and S14 can be expressed by the following Expression 2. In the expression, subscripts "e" and "o" respectively mean an even mode and an odd mode.

$$S_{11} = \frac{(\Gamma_e + \Gamma_o)}{2}$$

$$S_{12} = \frac{(\Gamma_e - \Gamma_o)}{2}$$

$$S_{13} = \frac{(T_e + T_o)}{2}$$

$$S_{14} = \frac{(T_e - T_o)}{2}$$

[Expression 2]

Respective terms $\Gamma_e$, $\Gamma_o$, $T_e$, $T_o$ in the above Expression 2 are represented by the following Expression 3.

$$\Gamma_e = \frac{A_e + B_e/Z_{system} - Z_{system}C_e - D_e}{A_e + B_e/Z_{system} + Z_{system}C_e + D_e}$$

$$\Gamma_o = \frac{A_o + B_o/Z_{system} - Z_{system}C_o - D_o}{A_o + B_o/Z_{system} + Z_{system}C_o + D_o}$$

$$T_e = \frac{2}{A_e + B_e/Z_{system} + Z_{system}C_e + D_e}$$

$$T_o = \frac{2}{A_o + B_o/Z_{system} + Z_{system}C_o + D_o}$$

[Expression 3]

In the above Expression 3, [Zsystem] is a normalized impedance (typically, 50Ω).

Respective terms $A_e$, $B_e$, $C_e$, $D_e$ and $A_o$, $B_o$, $C_o$, $D_o$ in the above Expression 3 are represented by the following Expression 4.

$$\begin{bmatrix} A_e & B_e \\ C_e & D_e \end{bmatrix} = \begin{bmatrix} \cosh\gamma_e l & Z_e \sinh\gamma_e l \\ \dfrac{1}{Z_e}\sinh\gamma_e l & \cosh\gamma_e l \end{bmatrix}$$

$$\begin{bmatrix} A_o & B_o \\ C_o & D_o \end{bmatrix} = \begin{bmatrix} \cosh\gamma_o l & Z_o \sinh\gamma_o l \\ \dfrac{1}{Z_o}\sinh\gamma_o l & \cosh\gamma_o l \end{bmatrix}$$

[Expression 4]

In the above Expression 4, "γ" is a propagation constant, and "Z" is a characteristic impedance of wiring. The subscripts "e" and "o" respectively mean an even mode and an odd mode in the same way as in the above. 'l' means the length of a transmission line.

Respective terms $\gamma_e, \gamma_o, Z_e, Z_o$ in the above Expression 4 are represented by the following Expression 5.

$$\gamma_e = \sqrt{(R_e + j\omega L_e)(G_e + j\omega C_e)}$$
$$\gamma_o = \sqrt{(R_o + j\omega L_o)(G_o + j\omega C_o)}$$
$$Z_e = \sqrt{\dfrac{R_e + j\omega L_e}{G_e + j\omega C_e}}$$
$$Z_o = \sqrt{\dfrac{R_o + j\omega L_o}{G_o + j\omega C_o}}$$

[Expression 5]

In the above Expression 5, "R" is a resistance per unit length of a transmission line, "L" is an inductance per unit length of a transmission line, "G" is a parallel conductance per unit length of a transmission line, and "C" is a capacitance per unit length of a transmission line. The subscripts "e" and "o" respectively mean an even mode and an odd mode in the same way as in the above. Furthermore, "ω" means an angular frequency of a transmission line, and ω=2πf (f: frequency).

For reference, FIGS. 7(a) and (b) show the state of an electric field and a magnetic field in an even mode and an odd mode of the symmetric coupled line 800. The even mode and the odd mode are described in the following Reference Document.

(Reference Document) K. C. Gupta, Ramesh Garg, Inder Bahl and Praksash Bhartia, "Microstrip Lines and Slotlines (ARTECH HOUSE ANTENNAS AND PROPAGATION LIBRARY)", Artech House Publishers, 1 Mar. 1996. pp. 457-469.

FIG. 7(a) shows the state of an electric field and a magnetic field in an even mode, and FIG. 7(b) shows the state of an electric field and a magnetic field in an odd mode.

In order to obtain an S matrix of a symmetric coupled line from the above Expression 5, a resistance "R", an inductance "L", a parallel conductance "G", a capacitance "C", a frequency f, and a length "l" of a transmission line are required. Among them, the resistance "R", the inductance "L", the parallel conductance "G", and the capacitance "C" (hereinafter, referred to as RLGC parameters) are determined by the configuration of the coupled line 800. The configuration of the coupled line 800 includes, for example, at least one of a transmission line length in the first line 11 and the second line 12 constituting the coupled line 800, a wire width, a wire interval (Gap), the thickness of the substrate 15 that is a dielectric, a dielectric constant of the substrate 15, a dielectric loss, and the like. The configuration of such a coupled line is represented by, for example, design data on a circuit board input by the input unit 2.

In the case of the symmetric coupled line 800, elements of an S matrix can be aggregated to a small number of S parameters (4 kinds of S parameters) due to the symmetry. Therefore, the calculation of an S matrix is easy, which enables an arithmetic operation with high precision to be performed within a short period of time.

However, in actual circuit wiring, a number of asymmetric coupled lines as well as symmetric coupled lines are present. The above arithmetic operation using an arithmetic approach is applicable to only a symmetric coupled line. According to the analysis with respect to conventional circuit wiring, as shown in FIG. 24(b), there is no other choice but to finely divide a circuit board to be analyzed into a mesh shape, and perform an electromagnetic analysis with respect to the meshed elements. Therefore, as the configuration of the circuit board to be analyzed becomes more complicated, a longer working time is required, and an analysis is not completed actually within a desired processing time in most cases.

On the other hand, the interference analysis device 10 in the present embodiment obtains an S matrix of an asymmetric coupled line by an arithmetic operation using an arithmetic approach. The asymmetric coupled line is a coupled line that is not symmetrical.

Figure 8:
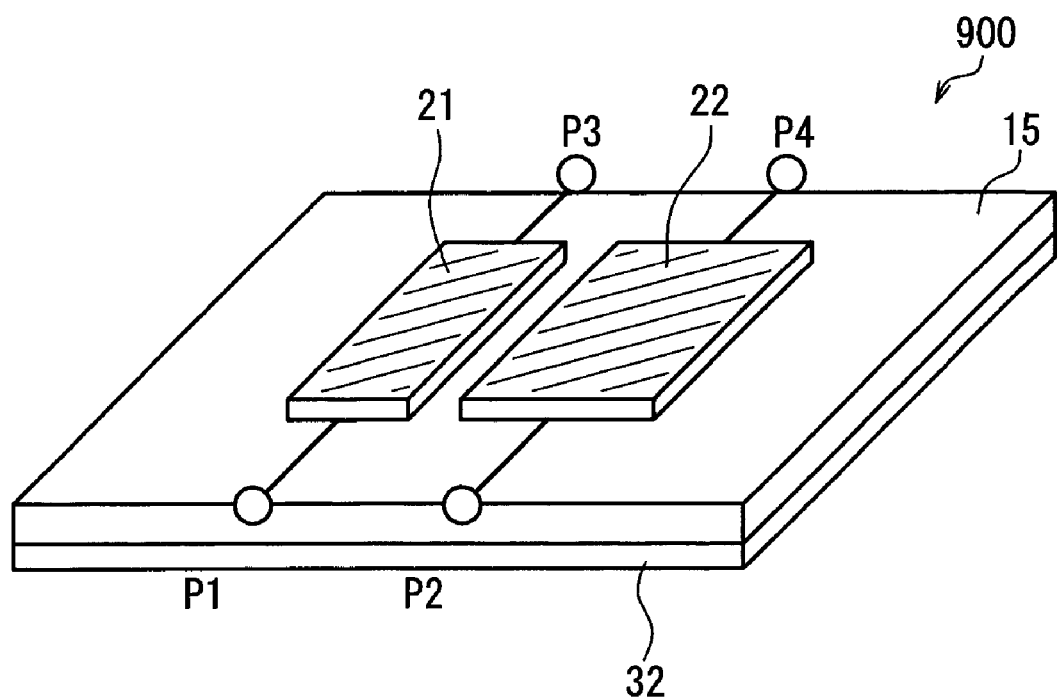
FIG. 8 is a diagram showing an example of an asymmetric coupled line.
Figure 9:
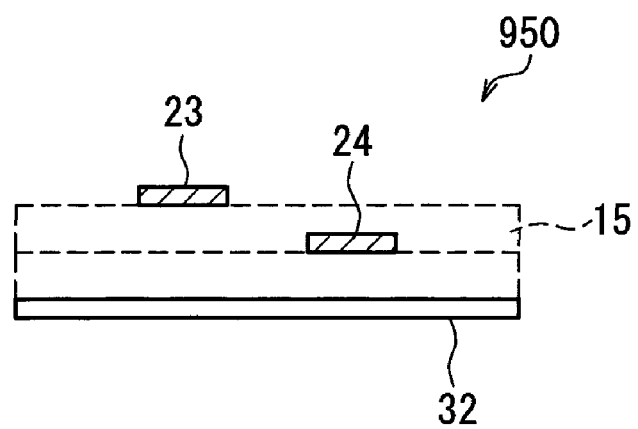
FIG. 9 is a diagram showing an example of the asymmetric coupled line.

FIGS. 8 and 9 are diagrams showing an example of an asymmetric coupled line. In a coupled line 900 shown in FIG. 8, the wire width of a first line 21 is different from that of a second line 22. FIG. 9 is a cross-sectional view of an asymmetric coupled line 950. In the coupled line 950, the layer configuration of a first line 23 is different from that of a second line 24. Although not shown, even in the case where the ground 32 formed below two wires varies in shape or position, the coupled line constituted by the two wires is an asymmetric coupled line.

In the case of such an asymmetric coupled line, the characteristic impedance of each wire constituting a coupled line varies depending upon the difference in configuration of the coupled line, such as a wire width, a layer configuration, and a dielectric thickness. Therefore, the number of kinds of S parameters constituting an S matrix of an asymmetric coupled line is larger than that of a symmetric coupled line.

As an example, an S matrix of a coupled line 900 shown in FIG. 8 will be shown in the following Expression 6.

$$S = \begin{bmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{bmatrix}$$

$$= \begin{bmatrix} S_{11} & S_{21} & S_{13} & S_{14} \\ S_{12} & S_{22} & S_{14} & S_{24} \\ S_{13} & S_{14} & S_{11} & S_{12} \\ S_{14} & S_{24} & S_{12} & S_{22} \end{bmatrix}$$

[Expression 6]

In the S matrix represented by the above Expression 6, S14=S41=S23=S32, S12=S21=S43=S34, S33=S11, S22=S44 due to the symmetry of the coupled line 900. Thus, in order to obtain an S matrix of the asymmetric coupled line 900, 6 kinds of S parameters (4 kinds of S parameters S11, S12, S13, S14 with S22 and S24 added thereto) are required.

In the interference analysis device 10 in the present embodiment, the calculation unit 6 can calculate 6 kinds of S parameters of an asymmetric coupled line from the RLGC parameters, using an ASP parameter.

More specifically, the inventors of the present application performed mathematical development of a complicated S matrix composed of 6 kinds of S parameters without proceeding toward the processing as shown in FIG. 24(b), and used the ASP in the development, thereby having achieved a procedure just like the arithmetic operation of a symmetric coupled line.

Only by using such a procedure, S parameters can be generated from the resistance in an even mode and an odd mode, the inductance, the parallel conductance, the capacitance ($R_e$, $L_e$, $G_e$, $C_e$, $R_o$, $L_o$, $G_o$, $C_o$), the ASP, the transmission line length l, and the frequency f. More specifically, S parameters cannot be obtained from $R_e$, $L_e$, $G_e$, $C_e$, $R_o$, $L_o$, $G_o$, $C_o$, the transmission line length l, and the frequency f without the ASP, except for the case of a symmetric coupled line. Consequently, in order to obtain S parameters with respect to an asymmetric coupled line, as shown in FIG. 24(b), it is necessary to perform an electromagnetic analysis with respect to a meshed model.

Hereinafter, a specific example in the case of calculating S parameters of the asymmetric coupled line 900 using the ASP will be described. The electric equivalent circuit of the coupled line 900 shown in FIG. 8 is represented by an equivalent circuit diagram of a 4-terminal circuit shown in FIG. 10, and a circuit equation of the 4-terminal circuit represented by the equivalent circuit diagram shown in FIG. 10 is solved, whereby S parameters of the S matrix of the coupled line 900 can be calculated.

Figure 10:
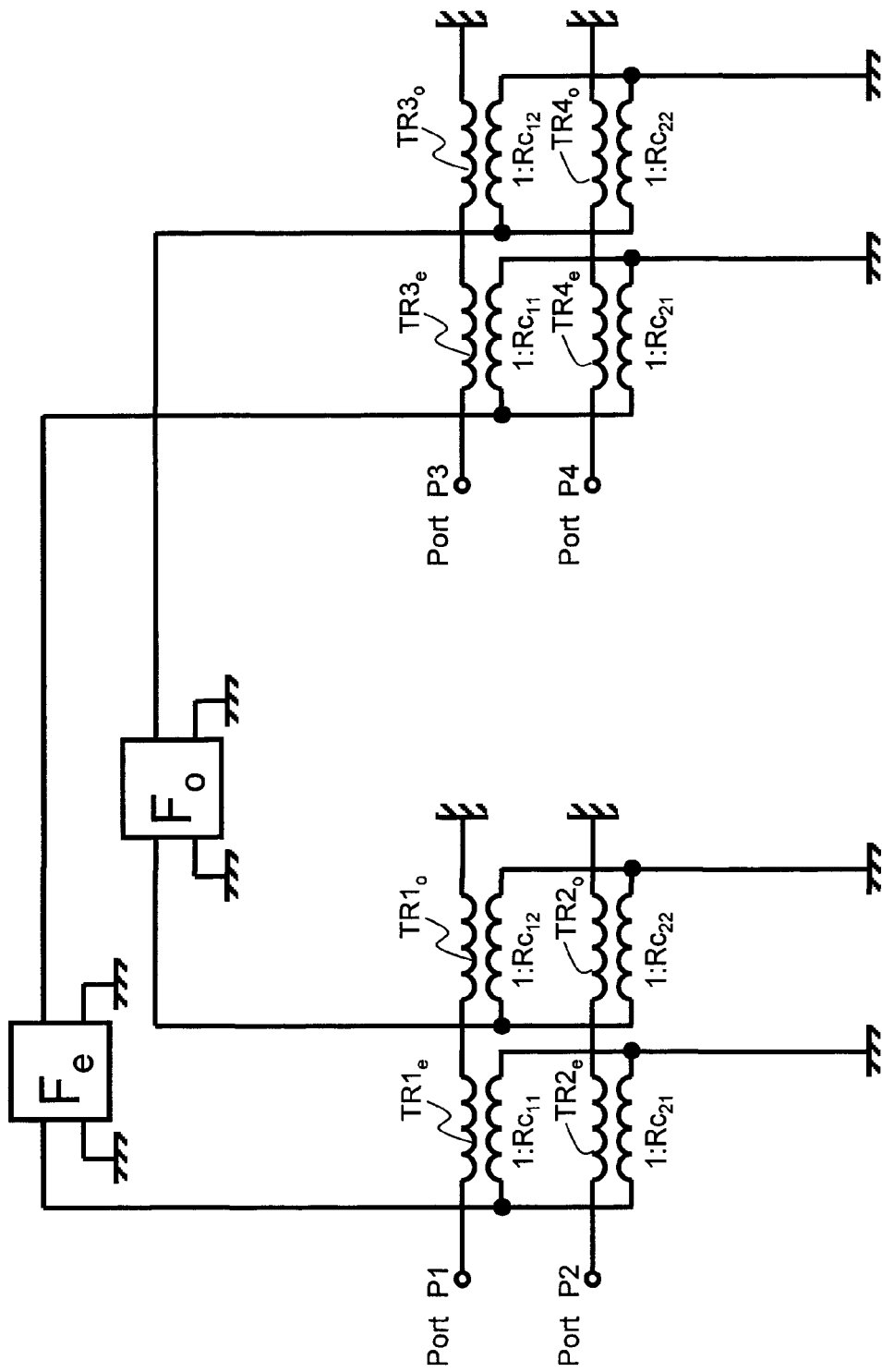
FIG. 10 is a diagram showing an electric equivalent circuit of the coupled line shown in FIG. 8.

In the equivalent circuit shown in FIG. 10, $F_e$ denotes a 4-terminal circuit, and one terminal of the four terminals is connected to ports P1, P2 respectively via transformers $TR1_e$, $TR2_e$. Another terminal of the 4-terminal circuit $F_e$ is connected to ports P3, P4 respectively via transformers $TR3_e$, $TR4_e$. The remaining two terminals of the 4-terminal circuit $F_e$ are grounded.

$F_o$ also is a 4-terminal circuit, and one terminal of the four terminals is connected to the ports P1, P2 respectively via transformers $TR1_o$, $TR2_o$. Another terminal of the 4-terminal circuit $F_o$ is connected to the ports P3, P4 respectively via the transformers $TR3_o$, $TR4_o$. The remaining two terminals of the 4-terminal circuit $F_o$ are grounded.

The 4-terminal circuits $F_e$, $F_o$ are equivalent circuits of one line. The circuit matrix of the 4-terminal circuit $F_e$ is represented by, for example, a matrix including $A_e$, $B_e$, $C_e$, $D_e$ shown by the above Expression 4, and the circuit matrix of the 4-terminal circuit $F_o$ is represented by, for example, a matrix including $A_o$, $B_o$, $C_o$, $D_o$ represented by the above Expression 4.

It is assumed that the ratio between the winding number of a coil on the port P1 side in the transformer $TR1_e$ and the winding number of a coil on the $F_e$ side is $1:RC_{11}$. The winding number ratios of the transformers $TR2_e$, $TR1_o$, $TR2_o$ also are $1:RC_{21}$, $1:RC_{12}$, $1:RC_{22}$, respectively. Furthermore, the winding number ratio of the transformer $TR1_e$ is the same as that of the transformer $TR3_e$. Similarly, in each pair of transformers: the transformers $TR1_o$ and $TR3_o$; the transformers $TR2_e$ and $Tr4_e$; and the transformers $TR2_o$ and $TR4_o$, the winding number ratios are the same.

$Rc_{11}$, $Rc_{21}$, $Rc_{12}$, $Rc_{22}$ in each winding number ratio are values determined by the asymmetry of the coupled line 900. Theses values respectively are represented using the ASP, as shown in, for example, the following Expressions 7, 8, 9, and 10.

$$Rc_{11} = \frac{\sqrt{1+ASP^2}}{ASP} \quad \text{[Expression 7]}$$

$$Rc_{21} = \frac{\sqrt{1+ASP^2}}{ASP} \quad \text{[Expression 8]}$$

$$Rc_{12} = -\sqrt{1+ASP^2} \quad \text{[Expression 9]}$$

$$Rc_{22} = \sqrt{1+ASP^2} \quad \text{[Expression 10]}$$

The ASP in the above Expressions 7, 8, 9, and 1 is obtained approximately by, for example, the following Expression 11.

$$\sqrt{\frac{\text{Impedance of first line 21 alone}}{\text{Impedance of } second \text{ line 22 alone}}} \quad \text{[Expression 11]}$$

Figure 11:
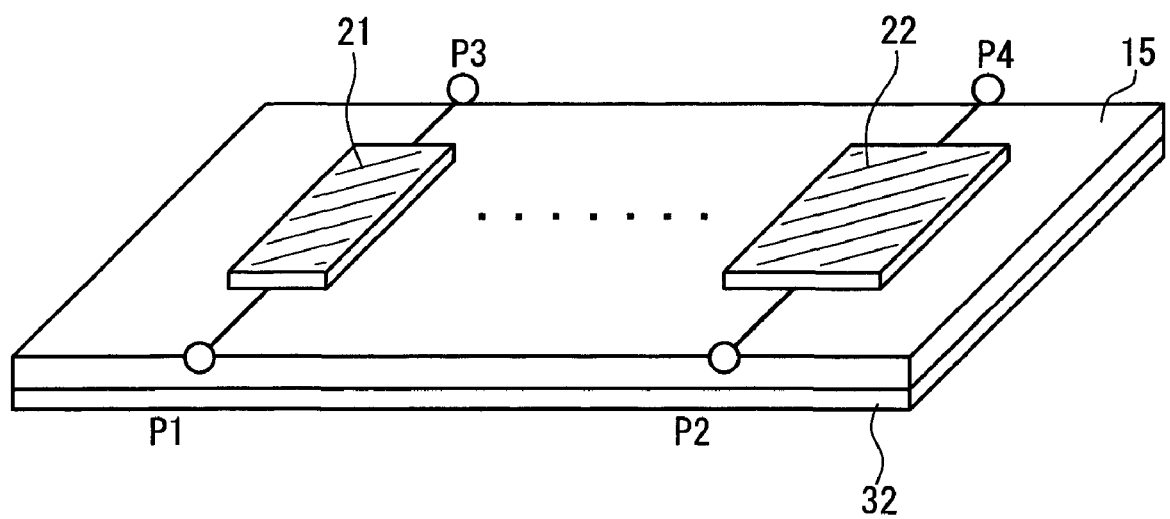
FIG. 11 shows a state where a first line 21 and a second line 22 are spaced away from each other sufficiently so as not to influence each other.

The impedance of the first line 21 alone refers to the impedance of the first line 21 in the case where it is assumed that the first line 21 and the second line 22 are spaced away from each other sufficiently so as not to influence each other, as shown in FIG. 11. Similarly, the impedance of the second line 22 alone refers to the impedance of the second line 22 in the case where it is assumed that the first line 21 and the second line 22 are spaced away from each other sufficiently so as not to influence each other.

Thus, the value that represents each difference degree of impedance of the lines included in a coupled line can be set to be an ASP representing asymmetry. The method for calculating an ASP is not limited to the calculation method using an impedance in the case where lines included in a coupled line are present alone.

Calculation expressions in the case of solving the equivalent circuit shown in FIG. 10, using ASP and RLGC parameters, thereby calculating each S parameter (i.e., S11, S12, S13, S14, S22, S24) of the above Expression 6 are represented by the following Expressions 12 to 17. Herein, as the ASP, the value obtained by the above Expression 11 can be used. In the following Expressions 12 to 17, $\Gamma_e$, $\Gamma_o$, $T_e$, and $T_o$ are as represented by the above Expression 3. "o" refers to an odd mode, and "e" refers to an even mode.

[Expression 12]

$S11 =$ $-(-9 + 6\Gamma o - \Gamma o^2 + Te^2 + 2\Gamma oTe^2 + \Gamma o^2 Te^2 + 8TeTo + To^2 - Te^2 To^2 -$ $2\Gamma e(-3 - 2\Gamma o + \Gamma o^2 - To^2) - \Gamma e^2(1 + 2\Gamma o + \Gamma o^2 - To^2) -$ $4ASP^6(-4 - 7\Gamma o + \Gamma o^2 - Te^2 - 3\Gamma oTe^2 - 2\Gamma o^2 Te^2 + 4TeTo -$ $To^2 + 2Te^2 To^2 + \Gamma e(-7 + 8\Gamma o + 3\Gamma o^2 - 3To^2) +$ $\Gamma e^2(1 + 3\Gamma o + 2\Gamma o^2 - 2To^2)) +$ $2ASP^4(7 - 5Te^2 + \Gamma o(36 - 8Te^2) + \Gamma o^2(5 - 3Te^2) -$ $5To^2 + 3Te^2 To^2 + \Gamma e^2(5 + 8\Gamma o + 3\Gamma o^2 - 3To^2) +$ $4\Gamma e(9 + 5\Gamma o + 2\Gamma o^2 - 2To^2)) -$ $4ASP^2(6 + \Gamma o^2 + \Gamma e^2(1 + \Gamma o) - Te^2 - \Gamma o(5 + Te^2) -$ $4TeTo - To^2 + \Gamma e(-5 + \Gamma o^2 - To^2)) +$ $ASP^8(3 + Te^2 - 2\Gamma o(-1 + Te^2) - \Gamma o^2(1 + 3Te^2) - 8TeTo +$ $To^2 + 3Te^2 To^2 + \Gamma e^2(-1 + 2\Gamma o + 3\Gamma o^2 - 3To^2) +$ -continued
$$2\Gamma e(1-6\Gamma o+\Gamma o^2-To^2)))/$$
$$(-9+6\Gamma o-\Gamma o^2+Te^2+2\Gamma oTe^2+\Gamma o^2Te^2+8TeTo+$$
$$To^2-Te^2To^2-\Gamma e^2(1+2\Gamma o+\Gamma o^2-To^2)+$$
$$\Gamma e(6+4\Gamma o-2\Gamma o^2+2To^2)+4ASP^2($$
$$-15+2\Gamma o+\Gamma o^2-Te^2-2\Gamma oTe^2-\Gamma o^2Te^2-To^2+Te^2To^2+$$
$$2\Gamma e(1+2\Gamma o+\Gamma o^2-To^2)+\Gamma e^2(1+2\Gamma o+\Gamma o^2-To^2))+$$
$$4ASP^6(-15+2\Gamma o+\Gamma o^2-Te^2-2\Gamma oTe^2-\Gamma o^2Te^2-$$
$$To^2+Te^2To^2+2\Gamma e(1+2\Gamma o+\Gamma o^2-To^2)+$$
$$\Gamma e2(1+2\Gamma o+\Gamma o^2-To^2))-$$
$$2ASP^4(59-3Te^2+\Gamma o(14-6Te^2)-3\Gamma o^2(-1+Te^2)+$$
$$8TeTo-3To^2+3Te^2To^2+2\Gamma e(7+10\Gamma o+3\Gamma o^2-3To^2)+$$
$$3\Gamma e^2(1+2\Gamma o+\Gamma o^2-To^2))+$$
$$ASP^8(-9+Te^2+\Gamma o^2(-1+Te^2)+2\Gamma o(3+Te^2)+$$
$$8TeTo+To^2-Te^2To^2-\Gamma e^2(1+2\Gamma o+\Gamma o^2-To^2)+$$
$$\Gamma e(6+4\Gamma o-2\Gamma o^2+2To^2)))$$

[Expression 13]

$$S12=(4ASP(1+ASP^2)((-1+ASP^2)^2\Gamma o^2-(-1+ASP^2)^2\Gamma e^2(1+\Gamma o)+$$
$$\Gamma o(-3+Te^2+ASP^4(-3+Te^2)-2ASP^2(5+Te^2))+$$
$$(-1+ASP^2)^2(Te^2-To^2)+\Gamma e(3+\Gamma o^2-To^2-$$
$$2ASP^2(-5+\Gamma o^2-To^2)+ASP^4(3+\Gamma o^2-To^2))))/$$
$$(9-6\Gamma o+\Gamma o^2-Te^2-2\Gamma oTe^2-\Gamma o^2Te^2-8TeTo-To^2+$$
$$Te^2To^2+2\Gamma e(-3-2\Gamma o+\Gamma o^2-To^2)+$$
$$\Gamma e^2(1+2\Gamma o+\Gamma o^2-To^2)+ASP^8(9-Te^2-$$
$$\Gamma o^2(-1+Te^2)-2\Gamma o(3+Te^2)-8TeTo-To^2+Te^2To^2+$$
$$2\Gamma e(-3-2\Gamma o+\Gamma o^2-To^2)+\Gamma e^2(1+2\Gamma o+\Gamma o^2-To^2))-$$
$$4ASP^2(-15+2\Gamma o+\Gamma o^2-Te^2-2\Gamma oTe^2-\Gamma o^2Te^2-$$
$$To^2+Te^2To^2+2\Gamma e(1+2\Gamma o+\Gamma o^2-To^2)+$$
$$\Gamma e^2(1+2\Gamma o+\Gamma o^2-To^2))-$$
$$4ASP^6(-15+2\Gamma o+\Gamma o^2-Te^2-2\Gamma oTe^2-\Gamma o^2Te^2-$$
$$To^2+Te^2To^2+2\Gamma e(1+2\Gamma o+\Gamma o^2-To^2)+$$
$$\Gamma e^2(1+2\Gamma o+\Gamma o^2-To^2))+$$
$$2ASP^4(59-3Te^2+\Gamma o(14-6Te^2)-3\Gamma o^2(-1+Te^2)+$$
$$8TeTo-3To^2+3Te^2To^2+2\Gamma e(7+10\Gamma o+3\Gamma o^2-3To^2)+$$
$$3\Gamma e^2(1+2\Gamma o+\Gamma o^2-To^2)))$$

[Expression 14]

$$S13=$$
$$-(4ASP^2(1+ASP^2)((3-ASP^2(-1+\Gamma e)+\Gamma e)^2To-(-1+ASP^2)^2Te^2$$
$$To+Te(9+6\Gamma o+\Gamma o^2-To^2+ASP^4(1-2\Gamma o+\Gamma o^2-To^2)-$$
$$2ASP^2(-3+2\Gamma o+\Gamma o^2-To^2))))/$$
$$(-9+6\Gamma o-\Gamma o^2+Te^2+2\Gamma oTe^2+\Gamma o^2Te^2+8TeTo+To^2-Te^2To^2-$$
$$\Gamma e^2(1+2\Gamma o+\Gamma o^2-To^2)+\Gamma e(6+4\Gamma o-2\Gamma o^2+2To^2)+$$
$$4ASP^2(-15+2\Gamma o+\Gamma o^2-Te^2-2\Gamma oTe^2-\Gamma o^2Te^2-$$
$$To^2+Te^2To^2+2\Gamma e(1+2\Gamma o+\Gamma o^2-To^2)+$$
$$\Gamma e^2(1+2\Gamma o+\Gamma o^2-To^2))+4ASP^6($$
$$-15+2\Gamma o+\Gamma o^2-Te^2-2\Gamma oTe^2-\Gamma o^2Te^2-To^2+Te^2To^2+$$
$$2\Gamma e(1+2\Gamma o+\Gamma o^2-To^2)+\Gamma e2(1+2\Gamma o+\Gamma o^2-To^2))-$$
$$2ASP^4(59-3Te^2+\Gamma o(14-6Te^2)-3\Gamma o^2(-1+Te^2)+$$
$$8TeTo-3To^2+3Te^2To^2+2\Gamma e(7+10\Gamma o+3\Gamma o^2-3To^2)+$$
$$3\Gamma e^2(1+2\Gamma o+\Gamma o^2-To^2))+$$
$$ASP^8(-9+Te^2+\Gamma o^2(-1+Te^2)+2\Gamma o(3+Te^2)+$$
$$8TeTo+To^2-Te^2To^2-\Gamma e^2(1+2\Gamma o+\Gamma o^2-To^2)+$$
$$\Gamma e(6+4\Gamma o-2\Gamma o^2+2To^2)))$$

[Expression 15]

$$S14=(4ASP(1+ASP^2)(-(-3+2\Gamma e+\Gamma e^2+ASP^4(-3+2\Gamma e+\Gamma e^2)-$$
$$2ASP^2(5+2\Gamma e+\Gamma e^2))To+(-1+ASP^2)^2Te^2To+$$
$$Te(-3+2\Gamma o+\Gamma o^2-To^2+ASP^4(-3+\Gamma o^2-To^2)-$$
$$2ASP^2(5+2\Gamma o+\Gamma o^2-To^2))))/$$
$$(-9+6\Gamma o-\Gamma o^2+Te^2+2\Gamma oTe^2+\Gamma o^2Te^2+8TeTo+To^2-$$
$$Te^2To^2-\Gamma e^2(1+2\Gamma o+\Gamma o^2-To^2)+$$
$$\Gamma e(6+4\Gamma o-2\Gamma o^2+2To^2)+4ASP^2(-15+2\Gamma o+$$
$$\Gamma o^2-Te^2-2\Gamma oTe^2-\Gamma o^2Te^2-To^2+Te^2To^2+$$
$$2\Gamma e(1+2\Gamma o+\Gamma o^2-To^2)+\Gamma e^2(1+2\Gamma o+\Gamma o^2-To^2))+$$
$$ASP^6(-15+2\Gamma o+\Gamma o^2-Te^2-2\Gamma oTe^2-\Gamma o^2Te^2-$$
$$To^2+Te^2To^2+2\Gamma e(1+2\Gamma o+\Gamma o^2-To^2)+$$
$$\Gamma e2(1+2\Gamma o+\Gamma o^2-To^2))-$$
$$2ASP^4(59-3Te^2+\Gamma o(14-6Te^2)-3\Gamma o^2(-1+Te^2)+$$
$$8TeTo-3To^2+3Te^2To^2+2\Gamma$$
$$e(7+10\Gamma o+3\Gamma o^2-3To^2)+3\Gamma e^2(1+2\Gamma o+\Gamma o^2-To^2))+$$
$$ASP^8(-9+Te^2+\Gamma o^2(-1+Te^2)+2\Gamma o(3+Te^2)+8TeTo+$$
$$To^2-Te^2To^2-\Gamma e^2(1+2\Gamma o+\Gamma o^2-To^2)+$$
$$\Gamma e(6+4\Gamma o-2\Gamma o^2+2To^2)))$$

[Expression 16]

$$S22=$$
$$(-3-2\Gamma o+\Gamma o^2-Te^2+2\Gamma oTe^2+3\Gamma o^2Te^2+8TeTo-To^2-3Te^2To^2-$$
$$2\Gamma e(1-6\Gamma o+\Gamma o^2-To^2)+\Gamma e^2(1-2\Gamma o-3\Gamma o^2+3To^2)+$$
$$4ASP^2(-4-7\Gamma o+\Gamma o^2-Te^2-3\Gamma oTe^2-2\Gamma o^2Te^2+4TeTo-$$
$$To^2+2Te^2To^2+\Gamma e(-7+8\Gamma o+3\Gamma o^2-3To^2)+$$
$$\Gamma e^2(1+3\Gamma o+2\Gamma o^2-2To^2))-2ASP^4($$
$$7-5Te^2+\Gamma o(36-8Te^2)+\Gamma o^2(5-3Te^2)-5To^2+3Te^2To^2+$$
$$\Gamma e^2(5+8\Gamma o+3\Gamma o^2-3To^2)+4\Gamma e(9+5\Gamma o+2\Gamma o^2-2To^2))+$$
$$4ASP^6(6+\Gamma o^2+\Gamma e^2(1+\Gamma o)-Te^2-\Gamma o(5+Te^2)-$$
$$4TeTo-To^2+\Gamma e(-5+\Gamma o^2-To^2))+$$
$$ASP^8(9-Te^2-\Gamma o^2(-1+Te^2)-2\Gamma o(3+Te^2)-8TeTo-$$
$$To^2+Te^2To^2+2\Gamma e(-3-2\Gamma o+\Gamma o^2-To^2)+$$
$$\Gamma e^2(1+2\Gamma o+\Gamma o^2-To^2)))/$$
$$(-9+6\Gamma o-\Gamma o^2+Te^2+2\Gamma oTe^2+\Gamma o^2Te^2+8TeTo+To^2-Te^2To^2-$$

-continued
$$\Gamma e^2(1+2\Gamma o+\Gamma o^2-T o^2)+\Gamma e(6+4\Gamma o-2\Gamma o^2+2T o^2)+$$
$$4ASP^2(-15+2\Gamma o+\Gamma o^2-Te^2-2\Gamma oTe^2-\Gamma o^2Te^2-$$
$$To^2+Te^2To^2+2\Gamma e(1+2\Gamma o+\Gamma o^2-To^2)+$$
$$\Gamma e^2(1+2\Gamma o+\Gamma o^2-To^2))+4ASP^6(-15+2\Gamma o+$$
$$\Gamma o^2-Te^2-2\Gamma oTe^2-\Gamma o^2Te^2-To^2+Te^2To^2+$$
$$2\Gamma e(1+2\Gamma o+\Gamma o^2-To^2)+\Gamma e2(1+2\Gamma o+\Gamma o^2-To^2))-$$
$$2ASP^4(59-3Te^2+\Gamma o(14-6Te^2)-3\Gamma o^2(-1+Te^2)+$$
$$8TeTo-3To^2+3Te^2To^2+2\Gamma e(7+10\Gamma o+3\Gamma o^2-3To^2)+$$
$$3\Gamma e^2(1+2\Gamma o+\Gamma o^2-To^2))+ASP^8(-9+Te^2+$$
$$\Gamma o^2(-1+Te^2)+2\Gamma o(3+Te^2)+8TeTo+To^2-Te^2To^2-$$
$$\Gamma e^2(1+2\Gamma o+\Gamma o^2-To^2)+\Gamma e(6+4\Gamma o-2\Gamma o^2+2To^2)))$$

[Expression 17]
$$S24=-(4(1+ASP^2)((1-\Gamma e+ASP^2(3+\Gamma e))2To-(-1+ASP^2)^2Te^2To+$$
$$Te(1-2\Gamma o+\Gamma o^2-To^2-2ASP^2(-3+2\Gamma o+\Gamma o^2-To^2)+$$
$$ASP^4(9+6\Gamma o+\Gamma o^2-To^2)))/$$
$$(-9+6\Gamma o-\Gamma o^2+Te^2+2\Gamma oTe^2+\Gamma o^2Te^2+8TeTo+To^2-$$
$$Te^2To^2-\Gamma e^2(1+2\Gamma o+\Gamma o^2-To^2)+$$
$$\Gamma e(6+4\Gamma o-2\Gamma o^2+2To^2)+$$
$$4ASP^2(-15+2\Gamma o+\Gamma o^2-Te^2-2\Gamma oTe^2-\Gamma o^2Te-To^2+Te^2To^2+$$
$$2\Gamma e(1+2\Gamma o+\Gamma o^2-To^2)+\Gamma e^2(1+2\Gamma o+\Gamma o^2-To^2))+$$
$$4ASP^6(-15+2\Gamma o+\Gamma o^2-Te^2-2\Gamma oTe^2-\Gamma o^2Te^2-$$
$$To^2+Te^2To^2+2\Gamma e(1+2\Gamma o+\Gamma o^2-To^2)+$$
$$\Gamma e2(1+2\Gamma o+\Gamma o^2-To^2))-$$
$$2ASP^4(59-3Te^2+\Gamma o(14-6Te^2)-3\Gamma o^2(-1+Te^2)+$$
$$8TeTo-3To^2+3Te^2To^2+2\Gamma e(7+10\Gamma o+3\Gamma o^2-3To^2)+$$
$$3\Gamma e^2(1+2\Gamma o+\Gamma o^2-To^2))+$$
$$ASP^8(-9+Te^2+\Gamma o^2(-1+Te^2)+2\Gamma o(3+Te^2)+8TeTo+$$
$$To^2-Te^2To^2-\Gamma e^2(1+2\Gamma o+\Gamma o^2-To^2)+$$
$$\Gamma e(6+4\Gamma o-2\Gamma o^2+2To^2)))$$

Thus, the asymmetric coupled line is replaced by an equivalent circuit with a configuration in which a circuit of a symmetric coupled line represented by RLGR parameters is connected to terminals via transformers represented by the ASP, and the circuit equation of the equivalent circuit is solved using the RLGC parameters and the ASP, whereby S parameters can be obtained.

Herein, the data representing an equivalent circuit of a coupled line is represented by circuit data that represents a circuit configuration, RLGC parameters ($R_e$, $L_e$, $G_e$, $C_e$) in an even mode, RLGC parameters ($R_o$, $L_o$, $G_o$, $C_o$) in an odd mode, and an ASP. The RLGC parameters and the ASP are determined by the configuration of the coupled line. For example, the above $R_e$, $L_e$, $G_e$, $C_e$, $R_o$, $L_o$, $G_o$, and $C_o$ can be calculated from the data representing a transmission line length (=segment length) of lines included in the coupled line, a wire width, a wire interval (Gap), the thickness of a dielectric in which the coupled line is placed, a dielectric constant, a dielectric loss, and the like, and S parameters per unit length of a transmission line.

$R_e$, $L_e$, $G_e$, $C_e$, $R_o$, $L_o$, $G_o$, $C_o$, ASP, and circuit data can be recorded in, for example, the recording unit 9 as a coupled line model. Because of this, the calculation unit 6 can obtain an S matrix of a coupled line, using the coupled line model.

In the above calculation example, an example of calculating a circuit matrix of an equivalent circuit (equivalent circuit in FIG. 10) that represents the asymmetry of the coupled line with transformers has been described. However, the equivalent circuit to be used for calculation is not limited to the equivalent circuit shown in FIG. 10. A circuit having a configuration different from that in FIG. 10 can be used as an equivalent circuit of the coupled line, as long as it is an equivalent circuit that reflects the asymmetry of the coupled line.

Herein, the mathematical meaning of the ASP will be described.

The ASP is a parameter that interpolates asymmetry, thereby enabling the processing as if symmetry is kept. This is introduced originally by the inventors of the present application in order to obtain a wiring interference with good efficiency. An asymmetry parameter is a parameter for mathematically rotating an S matrix so that an odd mode and an even mode have a 1:1 symmetric relationship in an asymmetric coupled line.

FIGS. 12(a) to 12(c) are explanatory views schematically showing mathematical images of the ASP. In an equivalent model of an asymmetric coupled line, as shown in FIG. 12(a), an even mode and an odd mode have a relationship of 1:ASP (tan θ=ASP). In contrast, in an equivalent model of a symmetric coupled line, as shown in FIG. 12(b), an even mode and an odd mode have a 1:1 relationship. More specifically, in an equivalent model in the case of asymmetric wiring, an even mode and an odd mode are displaced from a 1:1 relationship. Therefore, an S matrix composed of 4 rows and 4 columns of a coupled line is rotated mathematically by an angle (θ−π/4) so that an even mode and an odd mode have a 1:1 relationship (see FIG. 12(c)). As a mathematical image, the processing is performed by introducing the ASP. The above Expressions 12 to 17 represent an example of the processing of rotating an S matrix so that an even mode and an odd mode have a 1:1 relationship.

Thus, an S parameter of the S matrix represented by the above Expression 6 can be obtained by using 9 parameters composed of the RLGC parameter and the ASP in even/odd modes.

Herein, as an example, the relationship between the S parameters represented by the above Expression 6 and the asymmetric coupled line 900 shown in FIG. 8 will be described. The S parameters obtained by the above Expressions 12 to 17 are represented by a vector amount having a real part and an imaginary part. Assuming that the real part of S21 is $S21_{real}$, and the imaginary part of S21 is $S21_{imag}$, the absolute value of a coupling amount S21 between the ports P1 and P2 can be represented by the following Expression (2).

$$(S21_{real}^2+S21_{imag}^2)^{1/2} \qquad \text{Expression (2)}$$

Assuming that the phase of S21 is θ21, the phase of a coupling amount between the ports P1 and P2 can be expressed by the following Expression (3).

$$\tan(\theta 21)=S21_{imag}/S21_{real} \qquad \text{Expression (3)}$$

S12 represents the coupling amount between the ports P1 and P2, which is the same value as that of S21.

Similarly, the absolute value and phase of a coupling amount S41 between the ports P1 and P4 can be represented by the following Expressions (4) and (5), respectively. S41=S14.

$$(S41_{real}^2+S41_{imag}^2)^{1/2} \quad \text{Expression (4)}$$

$$\tan(\theta 41)=S41_{imag}/S41_{real} \quad \text{Expression (5)}$$

The absolute value and phase of a coupling amount S32 between the ports P2 and P3 can be represented by the following Expressions (6) and (7), respectively. S32=S23.

$$(S32_{real}^2+S32_{imag}^2)^{1/2} \quad \text{Expression (6)}$$

$$\tan(\theta 32)=S32_{imag}/S32_{real} \quad \text{Expression (7)}$$

The absolute value and phase of a coupling amount S43 between the ports P3 and P4 can be represented by the following Expressions (8) and (9), respectively. S43=S34.

$$(S43_{real}^2+S43_{imag}^2)^{1/2} \quad \text{Expression (8)}$$

$$\tan(\theta 43)=S43_{imag}/S43_{real} \quad \text{Expression (9)}$$

The absolute value and phase of a passing amount S31 between the ports P1 and P3 can be represented by the following Expressions (10) and (11), respectively. S31=S13.

$$(S31_{real}^2+S31_{imag}^2)^{1/2} \quad \text{Expression (10)}$$

$$\tan(\theta 31)=S31_{imag}/S31_{real} \quad \text{Expression (11)}$$

The absolute value and phase of a passing amount S42 between the ports P2 and P4 can be represented by the following Expressions (12) and (13), respectively. S42=S24.

$$(S42_{real}^2+S42_{imag}^2)^{1/2} \quad \text{Expression (12)}$$

$$\tan(\theta 42)=S42_{imag}/S42_{real} \quad \text{Expression (13)}$$

Herein, the coupling amount is represented by, for example, S12, S21, S14, S41, S23, S32, S34, and S43 among S parameters in the coupled line 900 shown in FIG. 8. The passing amount is represented by, for example, S13, S31, S24, and S42 among S parameters in the coupled line 900 shown in FIG. 8.

Thus, S parameters are calculated as complex numbers including a real part and an imaginary part, whereby the absolute value and phase of a coupling amount, and the absolute value and phase of a passing amount are calculated, as represented by the above Expressions (2) to (13). More specifically, in the coupled line 900 shown in FIG. 8, the absolute value and phase of each coupling amount between the ports P1 and P2, between the ports P1 and P4, between the ports P3 and P2, and between the ports P3 and P4 are calculated, and in addition, the absolute value and phase of a passing amount between the ports P1 and P3 and between the ports P2 and P4 also are calculated.

Particularly, in the case of calculating the coupling amount between wires where an interference occurs at a plurality of positions as shown in FIG. 4(a), an exact interference amount cannot be calculated merely by considering the absolute value of a coupling amount in a coupled line divided into segments. In the present embodiment, since the phase of a coupling amount in a coupled line also is calculated simultaneously, and furthermore, both the absolute value and the phase of a passing amount can be calculated, the interference amount between wires can be calculated with higher precision.

The smooth processing owing to the introduction of the ASP parameter is the result obtained by the study of the inventors of the present application. The achievement of the interference analysis device with the ASP introduced therein also is the result obtained by the inventors of the present application.

The circuit matrix of a coupled line is not limited to an S matrix. As the circuit matrix of a coupled line, for example, a Z matrix, a Y matrix, an F matrix, and a T matrix can be used, in addition to the S matrix used often in the art. The Z, Y, F, T parameters (i.e., parameters constituting the Z matrix, the Y matrix, the F matrix, and the T matrix) and the S parameters (i.e., parameters constituting the S matrix) can be converted into each other. It is convenient to use the T parameters for synthesis with respect to the cascaded connection of a circuit. However, since there is a circuit that cannot be defined with the T parameters, the S parameters have higher general versatility.

The interference analysis device 10 in the present embodiment can be used as a part of a design device of a circuit board for performing interference analysis processing.

EMBODIMENT 2

In Embodiment 2, the processing in Embodiment 1 will be described in more detail. The configuration of the interference analysis device in Embodiment 2 is the same as that of the interference analysis device 10 shown in FIG. 1.

Figure 13:
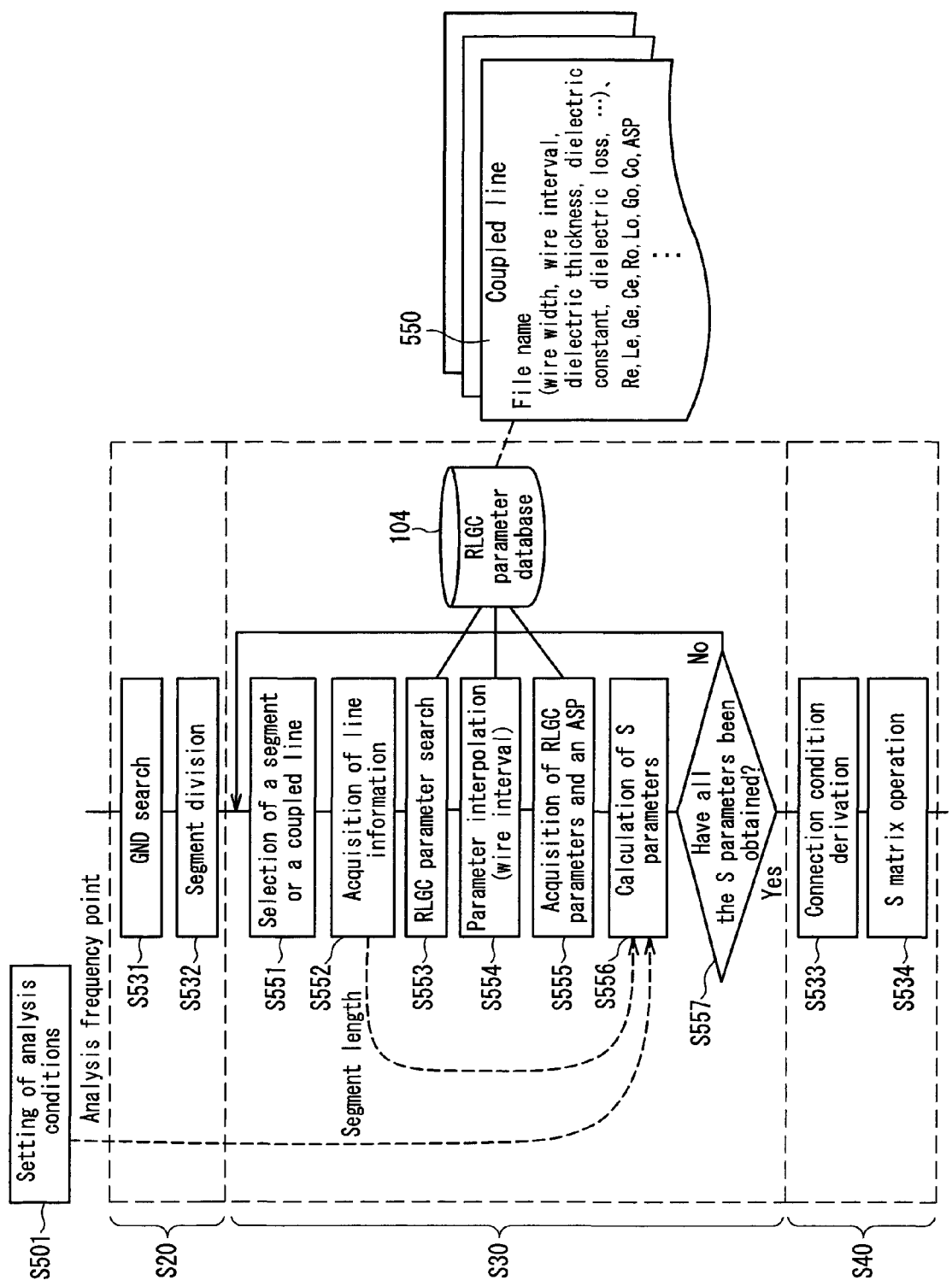
FIG. 13 is a flowchart showing the detail of the processings in Steps S20, S30, and S40 in the flowchart shown in FIG. 3.

FIG. 13 is a flowchart showing the detail of the processings in Steps S20, S30, and S40 in the flowchart shown in FIG. 3.

In Step S20, the division unit 5 performs a GND search (S531) and a segment division (S532).

In the GND search (S531), a ground pattern present in the analysis region, i.e., a pattern in an earth or ground region is extracted.

In the segment division (S532), when dividing wires into segments, the division unit 5 can set a portion, in which the angle of a wire changes as in a boundary 31a shown in FIG. 4(b), to be a boundary. Alternatively, there is a boundary dividing a wire into a portion 30c where two wires 204, 203 are arranged in parallel and a portion 30d where they are not arranged in parallel, as in a boundary 31b. Furthermore, regarding the portion where two wires are not arranged in parallel, for example, a portion crossing a wire in a different layer or a portion where the angle of a coupled line in the wire changes can be set to be a boundary of segments.

It is preferable that the division unit 5 divides wires into segments so that the number of segment pairs parallel to each other is larger. When the wires are divided into segments so that the number of parallel segments is larger, it becomes easier to shorten a processing time while maintaining high precision.

Furthermore, in the segment division, the ground pattern extracted in the GND search (S531) also is considered. For example, the division unit 5 can divide a wire so that a portion where the ground pattern is present in a layer and a portion where the ground pattern is not present in a layer either above or below the wire are placed in different segments.

A method for dividing wires into segments as described above is set previously in setting of interference analysis conditions (S510). The interference analysis conditions include, for example, an interference level (or an allowable interference amount), an analysis frequency (or a frequency point), and the like, in addition to the segment division method. In the setting of a segment division method, the fineness for segment division may be set.

In Step S30, the calculation unit 6 performs selection of a segment or a coupled line (S551). Generally, there are a plurality of segments in an analysis region, and the segments constitute a plurality of coupled lines. The calculation unit 6 selects one coupled line to be processed from coupled lines present in the analysis region. In the case where there are no coupled lines, the calculation unit 6 selects one segment.

The calculation unit 6 obtains line information of the selected coupled line. The line information represents the configuration of the coupled line. The line information contains, for example, a transmission line length (=a segment length) constituting the coupled line, a wire width, a wire interval (Gap), the thickness of a dielectric in which the coupled line is placed, a dielectric constant, a dielectric loss, and the like. The line information is contained, for example, in design data of a circuit board input by the input unit 2, so that the calculation unit 6 obtains line information from the design data.

The calculation unit 6 searches the RLGC parameter database 104 for RLGC parameters corresponding to the selected coupled line (S553). The RLGC parameter database 104 stores RLGC parameter data 550 corresponding to coupled lines with various configurations. The RLGC parameter data 550 contains RLGC parameters and an ASP. The RLGC parameter data 550 is stored so as to be associated with the line information on the coupled line. For example, the value "Re, Le, Ge, Ce, Ro, Lo, Go, Co, ASP" is stored in or saved to be linked to a file whose file name has a value "wire width, wire interval, dielectric thickness, dielectric constant, dielectric loss, . . . ". Herein "R" represents a resistance per unit length of a transmission line in a coupled line, "L" represents an inductance per unit length of the transmission line, "G" represents a parallel conductance per unit length of the transmission line, and "C" represents a capacitance per unit length of the transmission line. Subscripts "e" and "o" refer to an even mode and an odd mode, respectively.

Upon finding line information matched with the line information obtained in S552 in the RLGC parameter database 104, the calculation unit 6 obtains RLCG parameters and an ASP associated with the line information (S555).

When line information matched with the line information obtained in S552 is not found in the RLCG parameter search (S553), the calculation unit 6 performs interpolation, for example, with the line interval (Gap) in parameter interpolation (S554), thereby obtaining RLCG parameters and an ASP (S555).

More specifically, if RLCG parameters and an ASP corresponding to the configuration of the coupled line, such as a wire width in wiring in the coupled line selected by the calculation unit 6, the thickness of a dielectric between the wire and the ground, and an interval of the coupled line are not present in the RLCG parameter database 104, interpolation processing is performed. The interpolation processing is performed, using data corresponding to the line information close to the configuration of the coupled line which needs to obtain RLCG parameters and an ASP. An example of the interpolation processing includes the one with the wire interval (Gap). The detail of the interpolation processing with the wire interval will be described later.

Upon obtaining RLCG parameters and an ASP (S555), the calculation unit 6 calculates S parameters of the selected coupled line. The RLCG parameters and ASP obtained in S555 are used for calculating S parameters. Furthermore, the segment length obtained in Step S552 and the analysis frequency point set previously as the analysis conditions in the setting of analysis conditions (S501) also are used for calculating S parameters.

Specifically, the calculation unit 6 calculates S parameters of an S matrix represented by the above Expression 6, using the RLGC parameters, ASP, frequency, and segment length (transmission line length), thereby obtaining an S matrix. When an S matrix is calculated by the above Expression 6, the frequency set in the setting of analysis conditions (S501) is used in "ω" (ω=2πf) in the above Expression 5. In the case where the analysis frequency point is set with respect to a plurality of different frequencies, an S matrix can be obtained for the set plurality of frequency points.

The calculation unit 6 determines whether or not an S parameter has been calculated with respect to all the coupled lines included in the analysis region and segments not constituting the coupled lines (S557). The processings in S551 to S556 are repeated until S parameters are calculated with respect to all the coupled lines included in the analysis region and segments not constituting the coupled lines.

In Step S40, the interference amount calculation unit 71 performs connection condition derivation (S533). The connection condition derivation (S533) includes, for example, the processing of calculating a connection relationship between divided segments.

Upon deriving the connection conditions of each segment in Step S534, the interference amount calculation unit 71 calculates an interference amount between wires in the analysis region by performing an S matrix operation based on the connection conditions and the circuit matrix (S matrix) obtained in the S parameter calculation (S556).

Hereinafter, interpolation processing will be described. FIGS. 14-17 are graphs showing, for example, a relationship between the interval (Gap) between the first line 21 and the second line 22 in the coupled line 900 shown in FIG. 8, and the capacitance (C) or the inductance (L). In the coupled line 900 shown in FIG. 8, in the case where the interval between the first line 21 and the second line 22 changes while the shapes thereof do not change, an ASP does not change. Thus, in the graphs shown in FIGS. 14-17, the ASP is fixed at a constant value.

Figure 14:
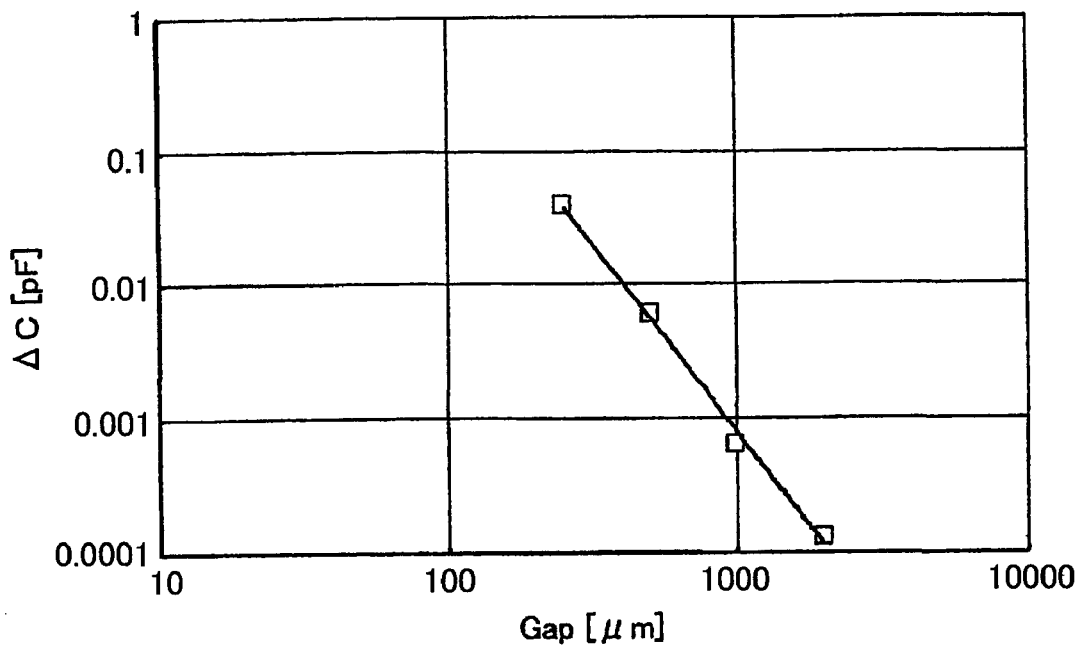
FIG. 14 is a graph in which a relationship between an interval (Gap) and $\Delta C$ is log plotted.
Figure 15:
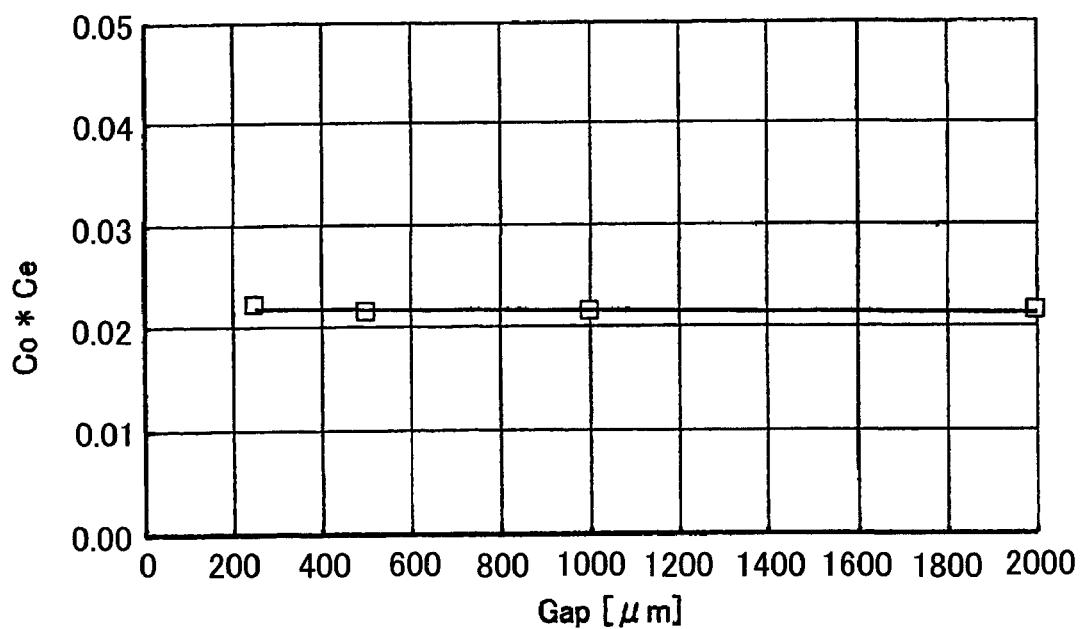
FIG. 15 is a graph in which a relationship between an interval (Gap) and Ce*Co is log plotted.

FIG. 14 is a graph in which a relationship between the interval (Gap) between the first line 21 and the second line 22, and Ce−Co (i.e., ΔC) in the coupled line 900 is log plotted. As shown in FIG. 14, ΔC plots are arranged on a straight line. FIG. 15 is a graph in which a relationship between the interval (Gap) between the first line 21 and the second line 22, and Ce*Co in the coupled line 900 is plotted. The value of Ce*Co is a constant value irrespective of the interval (Gap). It is understood from the graphs shown in FIGS. 14 and 15 that, in the coupled line 900, the values of Ce and Co of an arbitrary interval (Gap) can be interpolated if the values of Ce and Co of a certain interval (Gap) are known.

Figure 16:
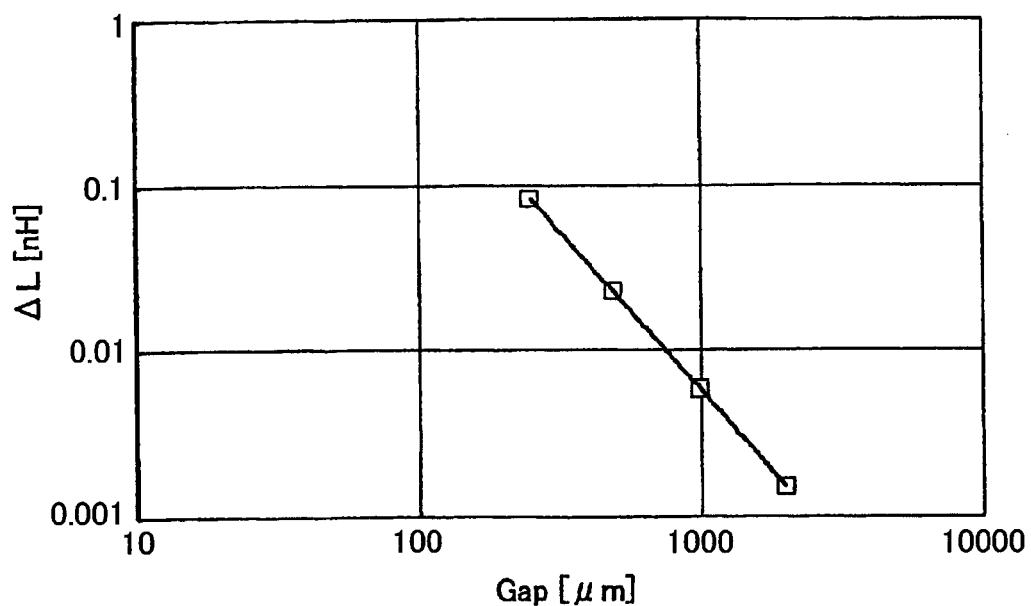
FIG. 16 is a graph in which a relationship between an interval (Gap) and $\Delta L$ is log plotted.
Figure 17:
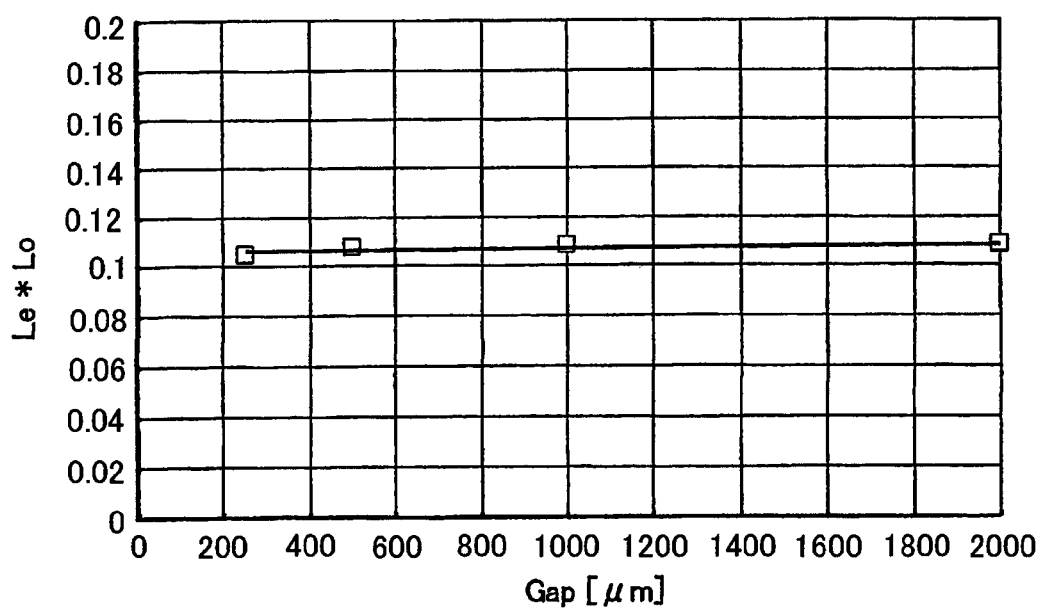
FIG. 17 is a graph in which a relationship between an interval (Gap) and Le*Lo is log plotted.

Similarly, FIG. 16 is a graph in which a relationship between the interval (Gap) between the first line 21 and the second line 22 in the coupled lines 900, and Le−Lo (i.e., ΔL) in the coupled line 900 is log plotted. As shown in FIG. 16, ΔL plots are arranged on a straight line. FIG. 17 is a graph in which a relationship between the interval (Gap) between the first line 21 and the second line 22, and Le*Lo in the coupled line 900 is plotted. The value of Le*Lo is a constant value irrespective of the interval (Gap). It is understood from the graphs shown in FIGS. 16 and 17 that, in the coupled line 900, the values of Le and Lo of an arbitrary interval (Gap) can be interpolated if the values of Le and Lo of a certain interval (Gap) is known.

Furthermore, the resistance (R) and the conductance (G) are constant values without depending upon the interval (Gap). Thus, 9 parameters of RLGC parameters and an ASP in even and odd modes at an arbitrary interval (Gap) can be determined by interpolation as long as the ASP is constant.

By using the ASP as in the present embodiment, the relationship between the interval (Gap) of a coupled line and the capacitance (C) or the inductance (L) can be approximated linearly as shown in FIGS. 14 to 17. In the case where such approximation cannot be performed, complicated calculation such as polynomial approximation using values at three or more points having different intervals (Gaps) is required for interpolation. As another method, there is a method for preparing values at a number of points having different intervals (Gaps) in a database and arranging them to such a degree that they can be approximated linearly. According to this method, there arises a problem of the database becoming enormous.

In contrast, by using the ASP, the interpolation with respect to an unknown interval (Gap) can be performed with high precision by simple calculation with two values: a value at a known interval (Gap) larger than an unknown interval (Gap) and a value at a known interval (Gap) smaller than an unknown interval (Gap).

According to the present embodiment, since the RLCG parameters and the ASP are obtained by interpolation, the size of the RLGC parameter database 104 can be decreased. Furthermore, an error caused by interpolation is reduced, and results with high precision can be obtained with a small amount of data.

COMPARATIVE EXAMPLE

Figure 19:
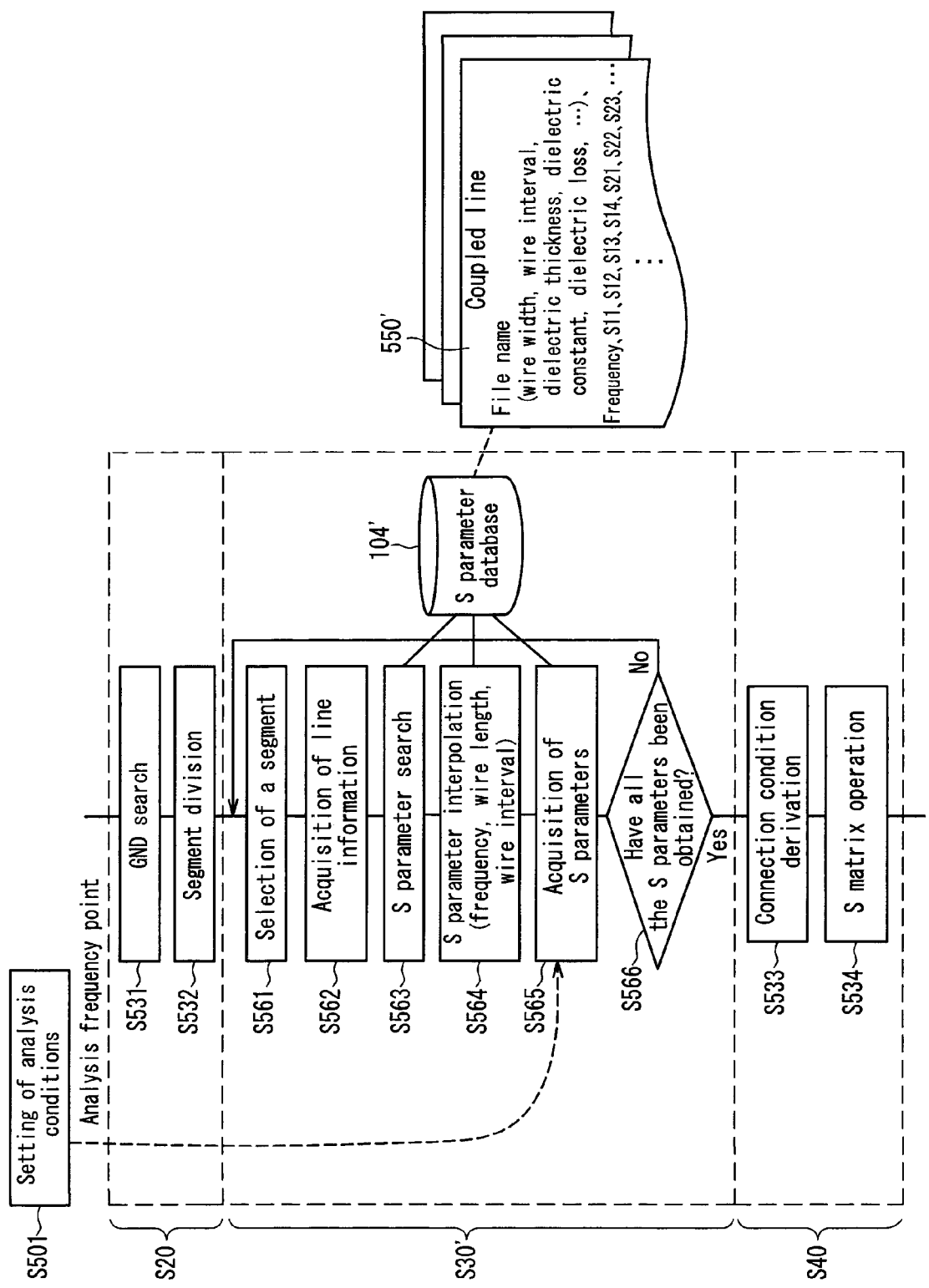
FIG. 19 is a flowchart showing an example of interference analysis processing performed using a database storing S parameters.

Herein, as a comparative example, an example of interference analysis processing in the case of using a database storing S parameters, without using the RLGC parameter database 104, will be described. FIG. 19 shows an example of interference analysis processing performed using a database storing S parameters.

The processing shown in FIG. 19 is obtained by replacing the processings (S551-S557) in Step S30 shown in FIG. 13 by Step S30' (S561-566).

In Step 30', selection of a segment (S561) and acquisition of line information (S562) are performed. These processings are the same as those (S551 and S552) shown in FIG. 13.

In the S parameter search (S563), the calculation unit 6 searches an S parameter database 104' for an S parameter corresponding to the coupled line selected in S561. In the S parameter database 104', S parameter data 550' is accumulated. The S parameter data 550' contains an S parameters and a frequency. The S parameter data 550 is stored so as to be associated with the line information of a coupled line. For example, a value "frequency, S11, S12, S13, . . . " is saved in a file whose file name has a value "wire width, wire interval, dielectric thickness, dielectric constant, dielectric loss, . . . ".

When the corresponding data has not been found in the S parameter search (S563), the calculation unit 6 performs interpolation with respect to each of a frequency, a wire length, and a wire interval in S parameter interpolation (S564). As a result of the interpolation, the calculation unit 6 obtains S parameters (S565).

When Steps S561 to S565 are repeated and all the S parameters are obtained (S566), derivation of connection conditions (S533) and an S matrix operation (S534) are performed.

Figure 12:
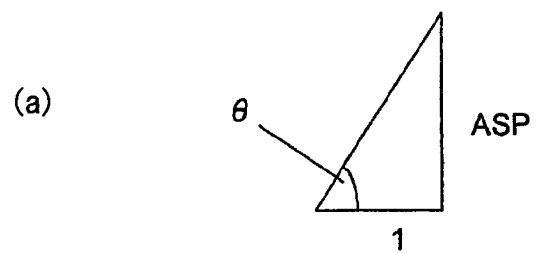
FIGS. 12($a$) to ($c$) are explanatory diagrams schematically showing mathematical images of an ASP.
Figure 12:
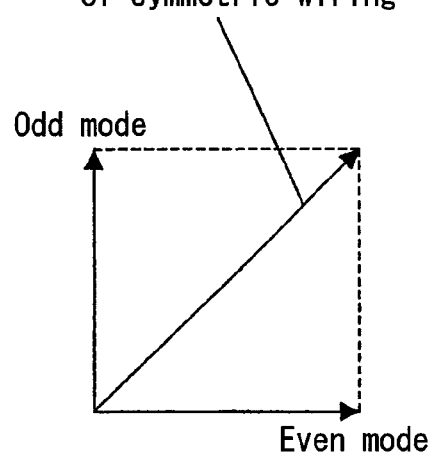
Figure 12:
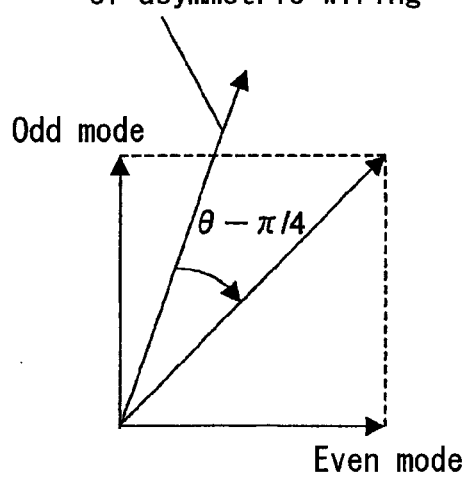

Thus, in Step S30' shown in FIG. 12, S parameters are not generated by an arithmetic operation. The processing in Step S30' is different from that in Step S30 shown in FIG. 13 in this point. Therefore, it is necessary that the S parameter database 104' stores a great number of models (more specifically, the S parameter data 550') previously. If the number of the S parameter data 550' is small, it also becomes difficult to use them as basic data for interpolation. Furthermore, the S parameter data 550' should be created for each frequency. Therefore, if the frequency point increases, a data amount increases. When the S parameter data 550' is prepared, for example, assuming that a frequency point is 400 points, the S parameter data 550' with respect to the configuration of one coupled line becomes about 240 KB (kilobytes). If the S parameter data 550' is prepared for each variation in configuration of coupled lines, 3000 to 4000 kinds are obtained in a 8-layered board assumed to be used actually, even excluding a variation related to a wire interval, a wire length, a dielectric thickness, a wire width, a dielectric constant, and a dielectric loss. If an attempt is made so as to prepare at least 5 kinds of wire intervals, at least 7 kinds of lengths, and at least 3 kinds of wire widths, about 310,000 to 420,000 combinations of the S parameter data 550' are obtained, which corresponds to about 75 to 100 GB (gigabytes) as a storage capacity. Furthermore, an enormous storage device is required if the addition of kinds related to other configurations are considered.

In the above comparative example, the S parameter database 104' to be prepared also is large. As the configuration of the coupled line becomes complicated (that is, in the analysis region, the number of coupled lines with different wire lengths and the number of coupled lines with different wire intervals increases), it is necessary to prepare a larger number of the S parameter data 550'. Furthermore, when the frequency point increases, the number of the S parameter data 550' also increases accordingly. In addition, it is practically impossible to prepare the S parameter data 550' corresponding to configurations of all the coupled lines and frequencies. Therefore, a large processing amount is required even for performing the S parameter interpolation (S564).

In contrast, in the present embodiment, S parameters are generated by an arithmetic operation using RLGC parameters and an ASP. Therefore, even if the pattern of a coupled line is complicated, the amount of data to be prepared in the RLGC parameter database 104 can be decreased. That is, it is not necessary to prepare a database in which an enormous amount of S parameters are accumulated. Furthermore, S parameter interpolation (S564) is not required, either.

Consequently, according to the present embodiment, a processing time can be shortened substantially while high precision is being maintained. That is, S parameters corresponding to any frequencies and lengths can be obtained with high precision within a short period of time by using nine parameters composed of RLGC parameters and an ASP in even and odd modes.

As described above, RLGC parameters and an ASP may be stored in the RLGC parameter database 104. More specifically, it is not necessary to use the S parameter database 104' in which the data amount becomes enormous when the number of frequency points increases. Therefore, the RLGC parameter database 104 becomes very simple, and the database size thereof decreases. Consequently, interference analysis can be performed with a small amount of computer resource.

Furthermore, the size of the RLGC parameter database 104 decreases, whereby all the databases can be stored on a RAM composed of a semiconductor. Therefore, when RLGC parameters are searched for from the RLGC parameter database 104 based on the line information for each coupled line, a search can be conducted at a high speed, compared with the case where a database in an external storage device 108 such as a hard disk is searched for.

The RLGC parameter data 550 stored in the RLGC parameter database 104 corresponds to an asymmetric coupled line model, respectively. The asymmetric coupled line model refers to an equivalent circuit model in the case where an asymmetric coupled line is replaced by the equivalent circuit model. By constructing each asymmetric coupled line model from the RLGC parameters and the ASP, items of a frequency and a wire length can be removed from the asymmetric coupled line model. More specifically, an S matrix of a coupled line including an arbitrary frequency can be calculated by an arithmetic operation using an asymmetric coupled line model. If an arithmetic operation is performed by adapting a desired frequency to an asymmetric coupled line model, an S matrix can be obtained with respect to an arbitrary frequency. More specifically, S matrices corresponding to wiring with any transmission line length and any frequency can be generated from one kind of asymmetric coupled line mode.

In the case of performing the interference analysis processing in the present embodiment, processing that cannot be performed practically in the conventional example can be performed. When there is no restriction to a memory capacity, the processing requiring at least 500 hours can be performed within a time of about 1/1,000,000 thereof or less. Specifically, in the case where a circuit board to be analyzed is a multi-layered board (8-layered board with a size of 40 mm×40 mm), the number of nets (number of wires connecting components) is 550, and the number of vias connecting layers electrically is 5000, the following results are obtained. More specifically, when analysis processing is performed with respect to a frequency of 20 points, using a Pentium (Registered Trademark) 4 processor CPU with a 3 GHz operation and a memory of 2 G bytes, the processing is completed typically within 8 hours, and is completed within 30 minutes to 5 hours depending upon the setting of analysis conditions. This processing cannot be performed by electromagnetic analysis according to a conventional moment method, and used to require at least 500 hours when an analysis is performed under a condition that the restriction of a memory amount is cleared.

EMBODIMENT 3

Figure 18:
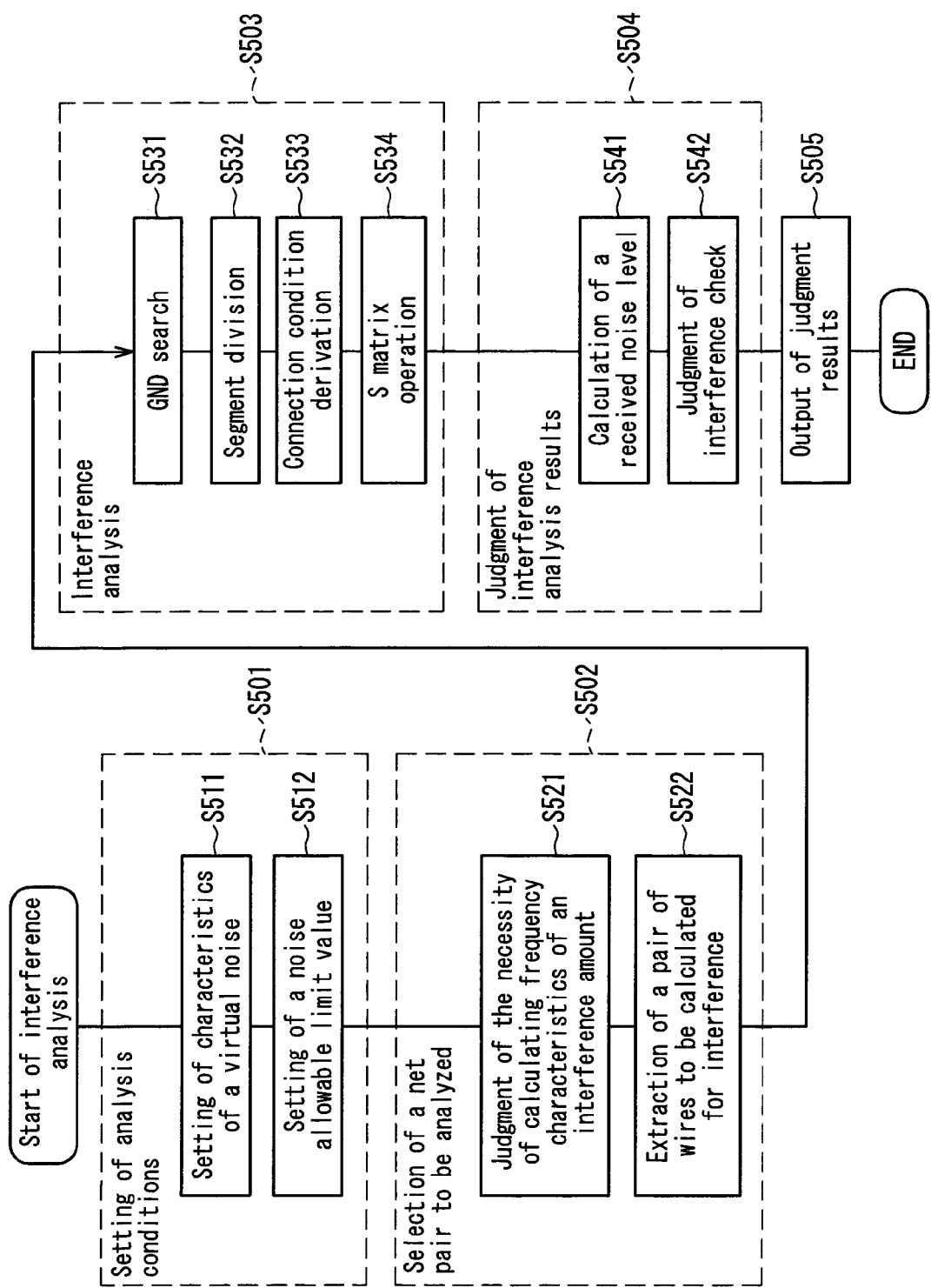
FIG. 18 is a flowchart showing processing performed by the interference analysis device.

FIG. 18 is a flowchart showing processing performed by an interference analysis device in Embodiment 3. The schematic configuration of the interference analysis device in Embodiment 3 is similar to the interference analysis device 10 shown in FIG. 1.

In the flowchart shown in FIG. 18, setting of analysis conditions by the condition setting unit 1 (S501), selection of a net pair to be analyzed by the pair selection unit 4 (S502), interference analysis by the division unit 5, the calculation unit 6, and the interference amount calculation unit 71 (S503), interference analysis result judgment by the judgment unit 72 (S504), and determination result output by the display device 107 (S505) are performed successively.

First, the condition setting unit 1 performs setting of characteristics of a virtual noise (S511). The setting of characteristics of a virtual noise refers to the setting of frequency characteristics of a virtual noise predicted to be generated from a terminal of a component included in a circuit board represented by design data. Generally, when design data is created, in a terminal of an active component to be mounted on a board and a terminal to be connected to an antenna or the like, frequency characteristics (virtual noise) of noise intensity are set. The condition setting unit 1 is capable of selecting a terminal to be analyzed from terminals of components in which virtual noises are set. In one wire, a plurality of virtual noises may be set in a plurality of terminals.

The condition setting unit 1 performs setting of a noise allowable limit value (S512). The setting of a noise allowable limit value refers to the setting of an allowable limit value of a noise received by a terminal of a component included in a circuit board represented by design data. More specifically, the setting of a noise allowable limit value refers to the setting of an interference amount reference value in a terminal of a component. Generally, when design data is created, a noise allowable limit value is set in a terminal of an active component to be mounted on a board and a terminal of a passive component. The condition setting unit 1 is capable of selecting a terminal to be analyzed from terminals of components in which noise allowable limit values are set.

Next, the pair selection unit 4 judges the necessity of frequency characteristics calculation of an interference amount with respect to each terminal of components included in the circuit board (S521). More specifically, the pair selection unit 4 extracts a pair of terminals, requiring frequency characteristics calculation of an interference amount from a combination of a terminal in which a virtual noise is set in S511 and a terminal in which a noise allowable limit value is set in S512. For example, the pair selection unit 4 compares the intensity of a virtual noise at a certain frequency with a noise allowable limit value at that frequency, regarding a pair of a terminal of a component in which a virtual noise is set and a terminal of a component in which a noise allowable limit value is set. The pair selection unit 4 is capable of judging the necessity of interference amount calculation by judging whether or not the virtual noise intensity exceeds the noise allowable limit value.

The pair selection unit 4 extracts a pair of wires to be calculated for an interference (S522). The pair selection unit 4 extracts a wire connected electrically to the pair of terminals extracted in S521. The pair selection unit 4 extracts a line connecting a terminal of a component to a terminal of another component in an electric circuit manner, considering the line as one wire. At some midpoint of the extracted wire, passive components such as a resistor, an inductor, a capacitor, a filter, and a connector, and a switch may be connected.

In the interference analysis (S503), the division unit 5 performs the ground search (S531) and the segment division (S532). The calculation unit 6 calculates a circuit matrix for each coupled line constituted by segments (not shown). The interference amount calculation unit 71 performs the connection condition derivation (S533) and the S matrix operation (S534). The processing of the interference analysis (S503) is substantially the same as that shown in FIG. 13, so that the description thereof will be omitted.

In the interference analysis result judgment (S504), the interference amount calculation unit 71 performs received noise level calculation (S541). In the received noise level calculation (S541), in the pair of wires extracted in S522, the level of a noise received by a terminal in which a noise allowable limit value is set is calculated. The interference amount calculation unit 71 calculates a received noise level based on the results of the S matrix operation (S534) and the intensity of a virtual noise set in the pair of wires.

In the pair of wires, if a plurality of virtual noises are set, a received noise level including the influence by each virtual noise is calculated. As a result of the S matrix operation (S534), the absolute value and phase of a coupling amount or a passing amount of a wire and a coupled line are calculated, so that effective synthesis considering a phase can be performed instead of simple integration of virtual noise intensity. This prevents an interference noise amount from being overestimated. Furthermore, when a plurality of virtual noises are set, the phase information or the relative difference in temporal timing in each virtual noise can be set. Consequently, the precision for synthesizing virtual noises can be enhanced.

The judgment unit 72 performs interference check judgment (S542). In the pair of wires, the judgment unit 72 compares the received noise level at a predetermined terminal obtained in the received noise level calculation (S541) with the noise allowable limit value set at the terminal. More specifically, it is judged whether or not the received noise level exceeds a noise allowable limit value. This judgment may be performed for a plurality of different frequencies. When the received noise level exceeds a noise allowable limit value, an interference is judged to be a problem in the pair of wires.

The display device 107 or the printing device 106 outputs determination results (S505).

Although the present invention has been described by way of preferable embodiments, such a description is not limiting, and can be modified variously. For example, in the wiring pattern shown in FIG. 4(b), an interference amount may be obtained, determining that the influence of segments that are not parallel to each other as in the segments 30a and 30d is negligible or small, and considering only a coupled line constituted by parallel segments. Alternatively, in order to calculate a more strict interference amount, an interference amount of a coupled line made of segments that are not parallel to each other may be obtained, using a predetermined coefficient.

Furthermore, if there is data (or a database) of S parameters as past data or known data, the data may be introduced into the RLGC parameter database 104. A part of the RLGC parameter data 550 may be set to be an S parameter that already has been calculated. Furthermore, in Embodiments 1, 2, and 3, although S parameters or an S matrix have been described, for example, the processing also can be performed using T parameters or a T matrix.

EMBODIMENT 4

In the present embodiment, a modified example of a calculation method for obtaining S parameters of an S matrix of a coupled line in Step 30 of the processing shown in FIG. 3 will be described. The modified example is an exemplary calculation method for obtaining S parameters of an S matrix of a coupled line including three lines. A method for calculating S parameters of an S matrix using RLGC parameters when a coupled line including three lines has a symmetric configuration is known. In the present embodiment, a method for calculating S parameters of an S matrix of a coupled line having an asymmetric configuration, using RLGC parameters, will be described. By using an ASP that is a parameter representing asymmetry, S parameters of a coupled line having an asymmetric configuration can be calculated.

Figure 20:
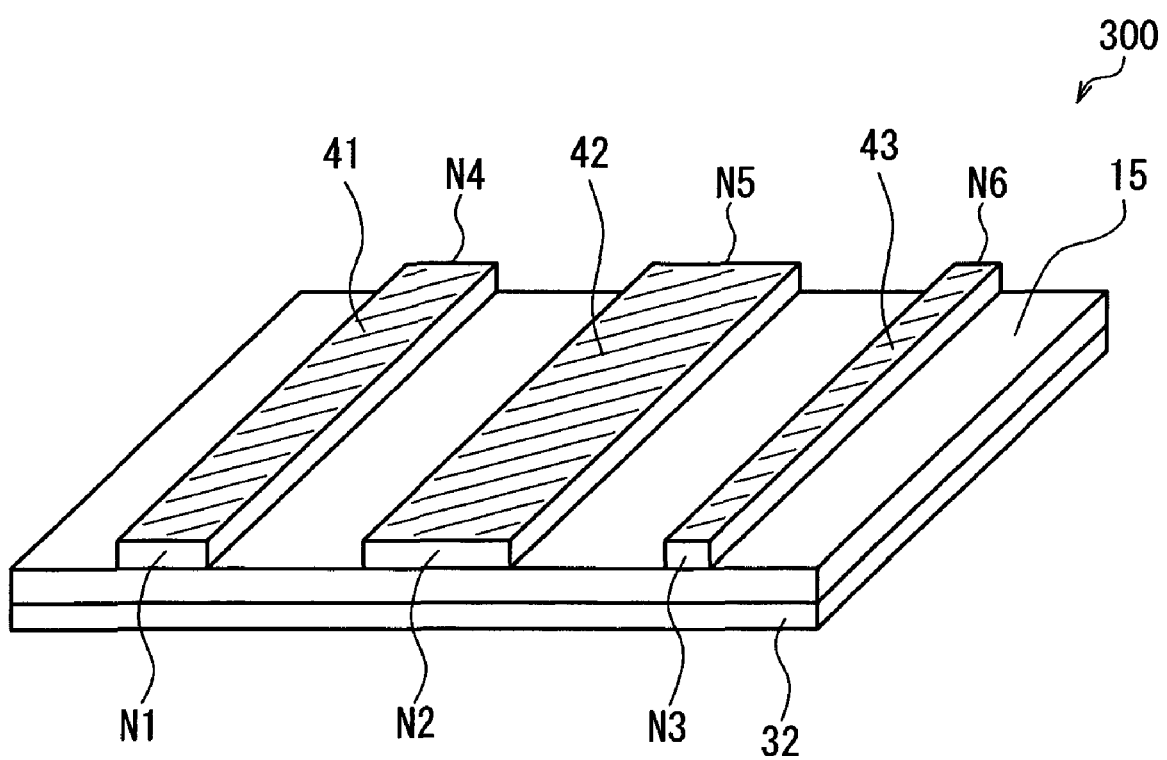
FIG. 20 is a diagram showing an exemplary configuration of a coupled line including three lines.

FIG. 20 is a view showing an exemplary configuration of a coupled line including three lines. A coupled line 300 shown in FIG. 20 is composed of a first line 41, a second line 42, and a third line 43 placed on a substrate 15. A ground 32 is provided on a lower surface of the substrate 15. The first line 41, the second line 42, and the third line 43 are plate-shaped bodies that are rectangular in a cross-section. The first line 41, the second line 42, and the third line 43 are placed so that long side directions of the plate-shaped bodies are parallel to each other. Line widths (lengths in a short side direction) of the first line 41, the second line, and the third line are different from each other. Therefore, the coupled line 300 is an asymmetric coupled line. Although not shown, an example of a symmetric coupled line includes a coupled line in which three lines having the same size and shape are arranged at an equal interval on an identical plane.

The first line 41 has a port N1 and a port N4, the second line 42 has a port N2 and a port N5, and the third line 43 has a port N3 and a port N6, respectively, at both ends in a long side direction. More specifically, the coupled line 300 has 6 terminals.

Figure 21:
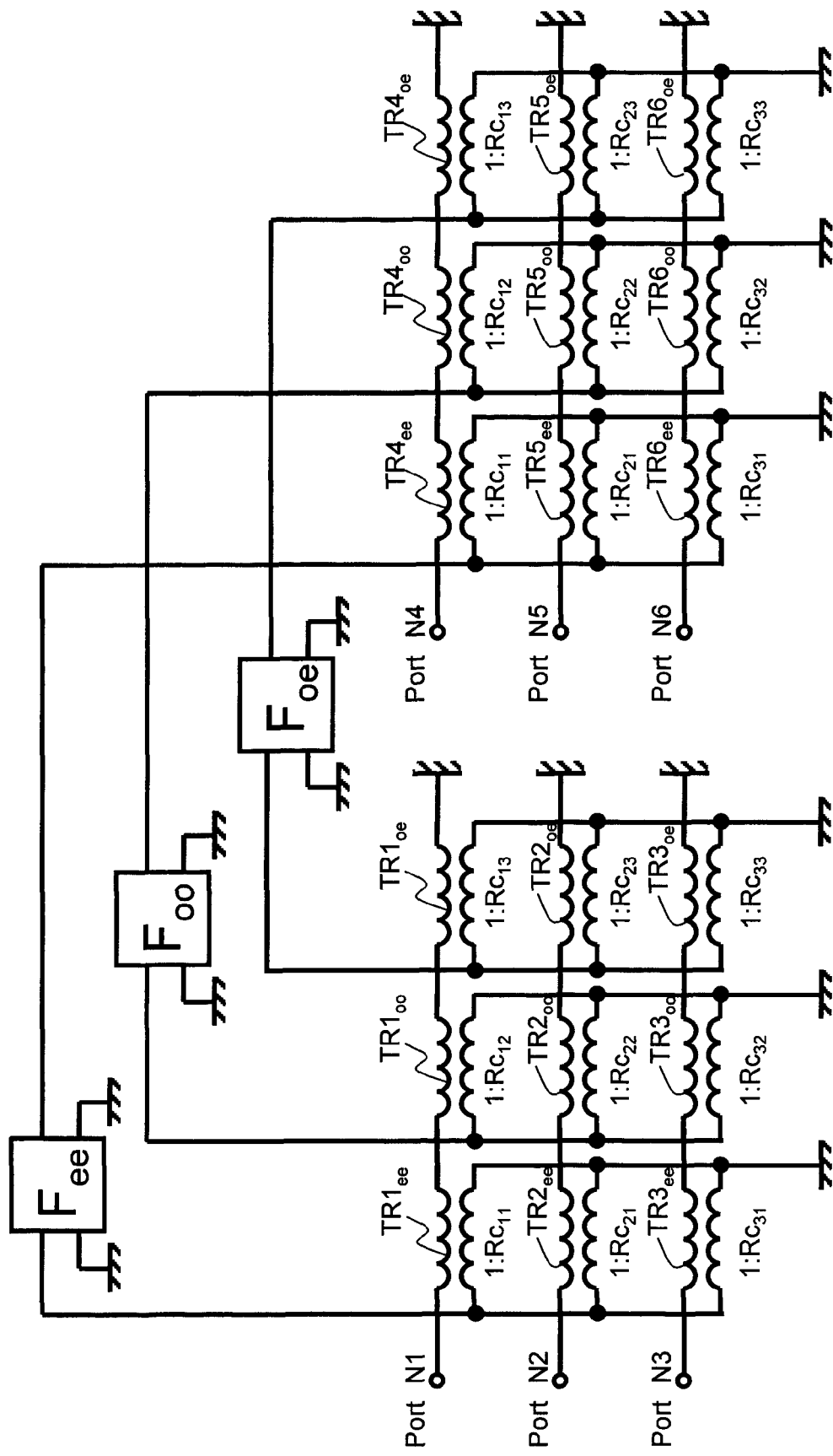
FIG. 21 is a diagram showing an electric equivalent circuit of the coupled line shown in FIG. 20.

In the present embodiment, as an example, an electric equivalent circuit of the coupled line shown in FIG. 20 is represented by an equivalent circuit diagram of a 6-terminal circuit shown in FIG. 21, and a circuit equation of the 6-terminal circuit represented by the equivalent circuit diagram shown in FIG. 21 is solved, whereby S parameters of an S matrix of the coupled line 300 can be calculated.

In the equivalent circuit shown in FIG. 21, $F_{ee}$ denotes a 4-terminal circuit, and one terminal among 4 terminals is connected to the ports N1, N2, and N3 respectively via transformers $TR1_{ee}$, $TR2_{ee}$, and $TR3_{ee}$. Another terminal of the 4-terminal circuit $F_{ee}$ is connected to the ports N4, N5, and N6 respectively via transformers $TR4_{ee}$, $TR5_{ee}$, and $TR6_{ee}$. The remaining two terminals of the 4-terminal circuit $F_{ee}$ are grounded.

$F_{oo}$ also is a 4-terminal circuit, and one terminal among 4 terminals is connected to the ports N1, N2, and N3 respectively via transformers $TR1_{oo}$, $TR2_{oo}$, and $TR3_{oo}$. Another terminal of the 4-terminal circuit $F_{oo}$ is connected to the ports N4, N5, and N6 respectively via transformers $TR4_{oo}$, $TR5_{oo}$, and $TR6_{oo}$. The remaining two terminals of the 4-terminal circuit $F_{oo}$ are grounded.

$F_{oe}$ also is a 4-terminal circuit, and one terminal among four terminals is connected to the ports N1, N2, and N3 respectively via transformers $TR1_{oe}$, $TR2_{oe}$, and $TR3_{oe}$. Another terminal of the 4-terminal circuit $F_{oe}$ is connected to the ports N4, N5, and N6 respectively via transformers $TR4_{oe}$, $TR5_{oe}$, and $TR6_{oe}$. The remaining two terminals of the 4-terminal circuit $F_{oe}$ are grounded.

The ratio between a winding number of a coil on the port N1 side in the transformer $TR1_{ee}$ and a winding of a coil on the $F_{ee}$ side therein is assumed to be $1:RC_{11}$. The winding number ratios of the transformers $TR2_{ee}$, $TR3_{ee}$, $TR4_{ee}$, $TR2_{oo}$, $TR3_{oo}$, $TR4_{oo}$, $TR2_{oe}$, $TR3_{oe}$, and $TR4_{oe}$ similarly are $1:RC_{21}$, $1:RC_{31}$, $1:RC_{12}$, $1:RC_{22}$, $1:RC_{32}$, $1:RC_{13}$, $1:RC_{23}$, and $1:RC_{33}$. Furthermore, the winding number ratio of the transformer $TR1_{ee}$ is the same as the winding number ratio of the transformer $TR4_{ee}$. Similarly, the winding number ratios in the respective transformer pairs: the transformer $TR1_{oo}$ and the transformer $TR4_{oo}$, the transformer $TR1_{oe}$ and the transformer $TR4_{oe}$, the transformer $TR2_{ee}$ and the transformer $TR5_{ee}$, the transformer $TR2_{oo}$ and the transformer $TR5_{oo}$, the transformer $TR2_{oe}$ and the transformer $TR5_{oe}$, the transformer $TR3_{ee}$ and the transformer $TR6_{ee}$, the transformer $TR3_{oo}$ and the transformer $TR6_{oo}$, and the transformer $TR3_{oe}$ and the transformer $TR6_{oe}$ are the same.

$RC_{11}$, $RC_{21}$, $RC_{31}$, $RC_{12}$, $RC_{22}$, $RC_{32}$, $RC_{13}$, $RC_{23}$, and $RC_{33}$ in each winding number ratio are the values determined depending upon the asymmetry of the coupled line 300. These values are represented by ASP1, ASP2, and ASP3 in the same way as in Embodiment 1. Herein, ASP1, ASP2, and ASP3 are represented by the following Expressions 18, 19, and 20.

$$ASP1 = \sqrt{\frac{Z_{even}1}{Z_{even}2}} \qquad \text{[Expression 18]}$$

$Z_{even}1$: Impedance in an even mode of the first line 41 and the second line 42

$Z_{even}2$: Impedance in an even mode of the third line 43 and the second line 42

In Expression 18, the ASP1 is calculated using the impedance in an even mode between lines adjacent to each other.

$$ASP2 = \sqrt{\frac{Z1}{Z3}} \qquad \text{[Expression 19]}$$

Z1: Impedance of the first line 41 alone in the case where the second line 42 is grounded Z3: Impedance of the third line 43 alone in the case where the second line 42 is grounded In Expression 19, in the coupled line 300, the ASP2 is calculated using an impedance of each of two lines (the first line 41 and the third line 43) alone, the distance of which is largest.

$$ASP3 = \sqrt{\frac{Z_{odd}1}{Z_{odd}2}}$$ [Expression 20]

$Z_{odd}1$: Impedance in an odd mode of the first line 41 and the second line 42

$Z_{odd}2$: Impedance in an odd mode of the third line 43 and the second line 42

In Expression 20, the ASP3 is calculated using an impedance in an odd mode between lines adjacent to each other The impedances $Z_{even}1, Z_{even}2, Z1, Z3, Z_{odd}1$ and $Z_{odd}2$ in the above Expressions 18 to 20 can be obtained, for example, by performing electromagnetic analysis, using an electromagnetic simulator or the like, with respect to design data representing the configuration of the coupled line 300. Examples of the design data representing the configuration of the coupled line 300 include a transmission line length in the coupled line 300, a transmission line length (=segment length), a wire width, a wire interval (Gap), the thickness of a dielectric in which the coupled line 300 is placed, a dielectric constant, a dielectric loss, and the like. Because of this, based on the design data representing the configuration of the coupled line 300, the ASP1, ASP2, and ASP3 representing the asymmetry of the coupled line 300 can be obtained. A method for obtaining the ASP1, ASP2, and ASP3 is not limited to the examples represented by the above Expressions 18-20.

The impedance of the first line 41 alone is the impedance of the first line 41 in the case of assuming that the first line 41 and another line are spaced away from each other sufficiently so as not to influence each other. The impedance of the second line 42 alone and the impedance of the third line 43 alone are similarly impedances when assuming that these lines and another line are spaced away from each other sufficiently so as not to influence each other.

The respective circuit matrices of the 4-terminal circuit $F_{ee}$, the 4-terminal circuit $F_{oo}$, and the 4-terminal circuit $F_{oe}$ are represented by the following Expressions 21, 22, and 23.

$$F_{ee} = \begin{bmatrix} A_{ee} & B_{ee} \\ C_{ee} & D_{ee} \end{bmatrix} = \begin{bmatrix} \cosh\gamma_{ee}l & Z_{ee}\sinh\gamma_{ee}l \\ \frac{1}{Z_{ee}}\sinh\gamma_{ee}l & \cosh\gamma_{ee}l \end{bmatrix}$$ [Expression 21]

$$F_{oo} = \begin{bmatrix} A_{oo} & B_{oo} \\ C_{oo} & D_{oo} \end{bmatrix} = \begin{bmatrix} \cosh\gamma_{oo}l & Z_{oo}\sinh\gamma_{oo}l \\ \frac{1}{Z_{oo}}\sinh\gamma_{oo}l & \cosh\gamma_{oo}l \end{bmatrix}$$ [Expression 22]

$$F_{eo} = \begin{bmatrix} A_{oe} & B_{oe} \\ C_{oe} & D_{oe} \end{bmatrix} = \begin{bmatrix} \cosh\gamma_{oe}l & Z_{oe}\sinh\gamma_{oe}l \\ \frac{1}{Z_{oe}}\sinh\gamma_{oe}l & \cosh\gamma_{oe}l \end{bmatrix}$$ [Expression 23]

In the above-mentioned Expressions 21, 22, and 23, "γ" represents a propagation constant, and "Z" represents a characteristic impedance of wiring. "l" represents the length of a transmission line. The subscripts "ee" and "oo" refer to an even mode and an odd mode, respectively, in the same way as in the above. The subscript "oe" refers to a mixed mode.

Figure 22:
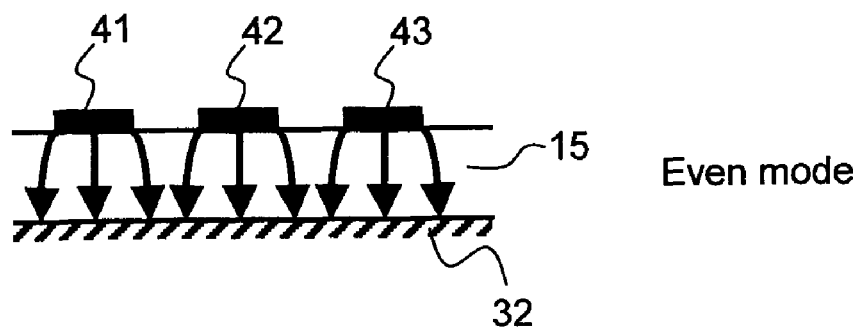
FIG. 22($a$) is a diagram showing the state of an electric field in an even mode. ($b$) is a diagram showing the state of an electric field in an odd mode. ($c$) is a diagram showing the state of an electric field in a mixed mode.
Figure 22:
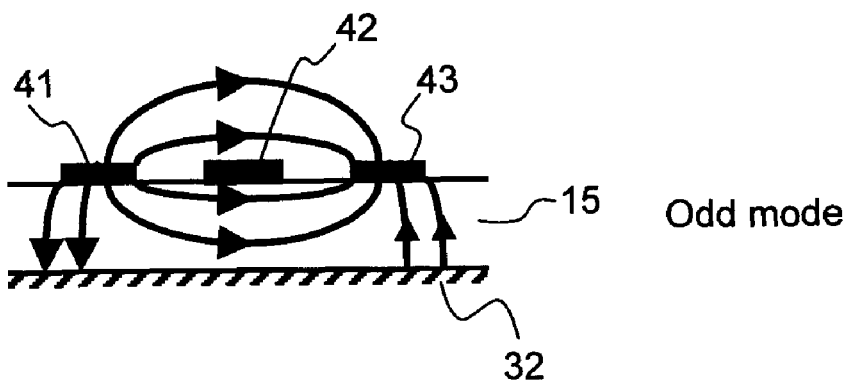
Figure 22:
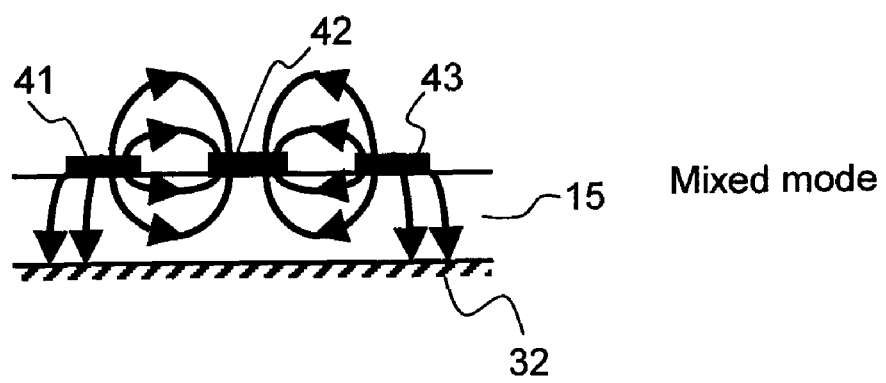

Hereinafter, referring to FIG. 22, the even mode, the odd mode, and the mixed mode in a coupled line including three lines will be described. FIG. 22 is a view showing a cross-section in a plane perpendicular to the substrate 15 of the coupled line 300 shown in FIG. 20. In FIG. 22, curves with arrows represent lines of electric force. The even mode, the odd mode, and the mixed mode are determined depending upon the distribution of the electric polarity of lines included in a coupled line.

FIG. 22(a) shows the state of an electric field in an even mode. In the even mode in FIG. 22(a), the electric potentials of three lines 41, 42, and 43 with respect to the ground 32 are all positive. More specifically, three lines 41, 42, and 43 all have the same electric polarity. Even when the electric polarities of three lines are all negative, the electric field also is in an even mode.

FIG. 22(b) shows the state of an electric potential in an odd mode. In the odd mode in FIG. 3(b), the electric potential of the first line 41 is positive with respect to the ground 32, the electric potential of the second line 42 is the same as that of the ground 32, and the electric potential of the third line 43 is negative with respect to the ground 32. Thus, in an odd mode, electric polarities are distributed so that the electric polarities of the two lines at both ends among three lines are opposite to the electric polarity of the line at the center.

FIG. 22(c) shows the state of an electric field in a mixed mode. In the mixed mode in FIG. 22(c), the electric potential of the first line 41 is positive with respect to the ground 32, the electric potential of the second line 42 is negative with respect to the ground 32, and the electric potential of the third line 43 is positive with respect to the ground 32. Thus, in the mixed mode, the electric polarities are distributed so that each electric polarity of the three lines is opposite to that of the adjacent line.

In the above Expressions 21, 22, and 23, $\gamma_{ee}, Z_{ee}, \gamma_{oo}, Z_{oo}, \gamma_{oe}$, and $Z_{oe}$ can be expressed by the following Expressions 24, 25, 26, 27, 28, and 29, respectively.

$$\gamma_{ee} = \sqrt{(R_{ee} + j\omega L_{ee})(G_{ee} + j\omega C_{ee})}$$ [Expression 24]

$$Z_{ee} = \sqrt{\frac{R_{ee} + j\omega L_{ee}}{G_{ee} + j\omega C_{ee}}}$$ [Expression 25]

In the above Expressions 24 and 25, $R_{ee}, L_{ee}, G_{ee}$, and $C_{ee}$ have the following meanings:

$R_{ee}$: resistance per unit length of a transmission line in an even mode $L_{ee}$: inductance per unit length of a transmission line in an even mode $G_{ee}$: parallel conductance per unit length of a transmission line in an even mode $C_{ee}$: capacitance per unit length of a transmission line in an even mode $$\gamma_{oo} = \sqrt{(R_{oo} + j\omega L_{oo})(G_{oo} + j\omega C_{oo})}$$ [Expression 26]

$$Z_{oo} = \sqrt{\frac{R_{oo} + j\omega L_{oo}}{G_{oo} + j\omega C_{oo}}}$$ [Expression 27]

In the above Expressions 26 and 27, $R_{oo}, L_{oo}, G_{oo}$, and $C_{oo}$ have the following meanings:

$R_{oo}$: resistance per unit length of a transmission line in an odd mode $L_{oo}$: inductance per unit length of a transmission line in an odd mode $G_{oo}$: parallel conductance per unit length of a transmission line in an odd mode $C_{oo}$: capacitance per unit length of a transmission line in an odd mode $$\gamma_{oe} = \sqrt{(R_{oe}+j\omega L_{oe})(G_{oe}+j\omega C_{oe})} \quad \text{[Expression 28]}$$

$$Z_{oe} = \sqrt{\frac{R_{oe}+j\omega L_{oe}}{G_{oe}+j\omega C_{oe}}} \quad \text{[Expression 29]}$$

In the above Expressions 28 and 29, $R_{oe}$, $L_{oe}$, $G_{oe}$, and $C_{oe}$ have the following meanings:

$R_{oe}$: resistance per unit length of a transmission line in a mixed mode $L_{oe}$: inductance per unit length of a transmission line in a mixed mode $G_{oe}$: parallel conductance per unit length of a transmission line in a mixed mode $C_{oe}$: capacitance per unit length of a transmission line in a mixed mode In the above Expressions 24-29, "ω" means the angular frequency of a transmission line.

Herein, a specific example of a method for calculating RLGC parameters ($R_{ee}$, $L_{ee}$, $G_{ee}$, $C_{ee}$, $R_{oo}$, $L_{oo}$, $G_{oo}$, $C_{oo}$, $R_{oe}$, $L_{oe}$, $G_{oe}$, $C_{oe}$) in each mode: an even mode, an odd mode, and a mixed mode included in the above Expressions 24-29 will be described. The RLGC parameters in each mode: an even mode, an odd mode, and a mixed mode are calculated, for example, using line information that is data representing the configuration of a transmission line included in a coupled line. The line information contains data representing, for example, a transmission line length (=a segment length) of a wire constituting a coupled line, a wire width, a wire interval (Gap), the thickness of a dielectric in which the coupled line is placed, a dielectric constant, and a dielectric loss. Coupled lines with various configurations are represented by the combination of these data. By performing an electromagnetic analysis using an electromagnetic simulator or the like, for example, with respect to coupled lines with various configurations represented by a plurality of variations in line information, S parameters per unit length of each transmission line are obtained regarding the coupled lines with various configurations. For example, using line information and S parameters of a coupled line having a particular configuration, RLGC parameters in each mode: an even mode, an odd mode, and a mixed mode with respect to the configuration of the coupled line can be calculated. More specifically, RLGC parameters in each of an even mode, an odd mode, and a mixed mode of a coupled line having a configuration specified by line information can be calculated from line information representing the configuration of the coupled line and S parameters per unit length of a transmission line constituting the coupled line. Thus, RLGC parameters can be calculated with respect to coupled lines with various configurations. The calculated RLGC parameters are recorded, for example, in the RLGC parameter recording unit 104 shown in FIG. 1.

Each circuit matrix of the 4-terminal circuit $F_{ee}$, the 4-terminal circuit $F_{oo}$, and the 4-terminal circuit $F_{oe}$ is obtained from the RLGC parameters in an even mode, an odd mode, and a mixed mode thus calculated and a frequency "f=ω/2π" to be analyzed (the above Expressions 21-23). The circuit equation of the equivalent circuit shown in FIG. 21 is solved using these circuit matrices and the ASPs obtained in the above Expressions 18-20, whereby S parameters of an S matrix of the equivalent circuit shown in FIG. 21 are obtained. Consequently, S parameters of an S matrix of the coupled line 300 at a frequency "f" are obtained from the RLGC parameters in an even mode, an odd mode, and a mixed mode, the frequency "ω", the ASP1, the ASP2, and the ASP3.

As described above, S parameters of an S matrix of a coupled line including three lines are calculated. Thus, the interference among three wires as well as the interference between two wires can be analyzed.

Figure 23:
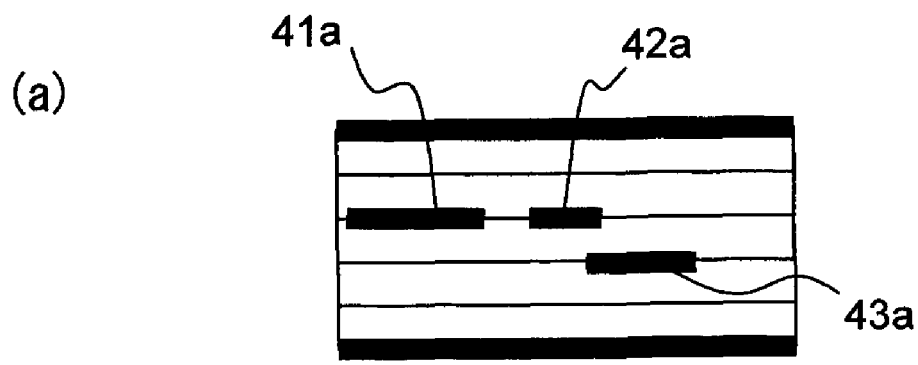
FIGS. 23($a$) and ($b$) are diagrams showing exemplary configurations of a coupled line including three lines.
Figure 23:
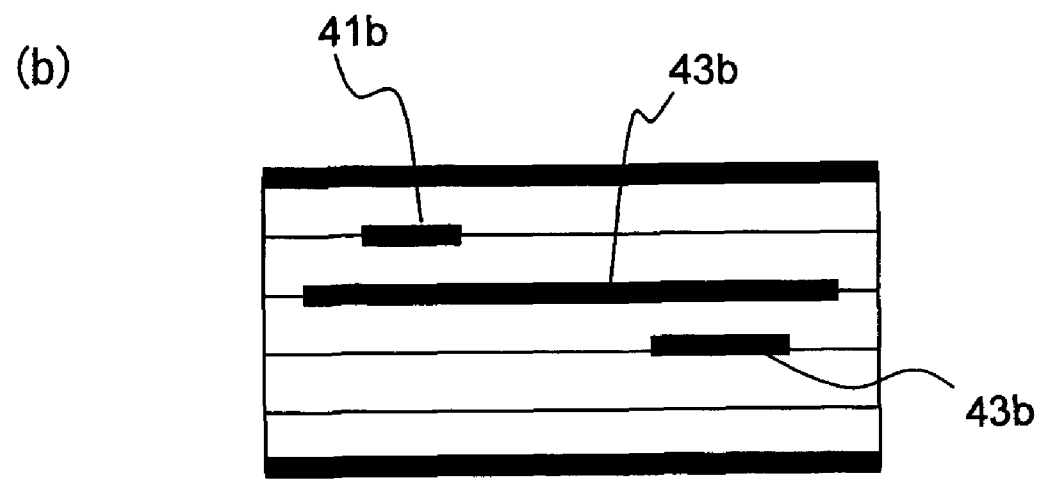

The configuration of a coupled line to which the above-mentioned method for calculating S parameters is applicable is not limited to that of the coupled line 300. Even regarding a coupled line including three lines with other configurations, S parameter can be obtained by the above-mentioned method. FIG. 23 shows an exemplary configuration of a coupled line including three lines. FIGS. 23(a) and 23(b) are views showing a cross-section in a plane perpendicular to a substrate of a coupled line including three lines. The examples shown in FIGS. 23(a) and 23(b) are the cases where a coupled line is composed of lines provided on different layers of a multi-layered board. In FIG. 23(a), a first line 41a and a second line 42a are provided on the same layer, and a third line 43a is provided on an underlying layer. Furthermore, in FIG. 23(b), the first line 41b, the second line 42b, and the third line 43b are provided on three different layers. The second line 42b is placed so as to overlap the first line 41b and the third line 43b in upper and lower directions in the figure.

In the configuration shown in FIG. 23(b), the second line 42b may be a ground. More specifically, a circuit matrix of a coupled line can be calculated, dealing with the ground as a line constituting the coupled line. Consequently, the interference even including the influence of the ground as well as the interference in one line can be analyzed. This enhances the precision of the analysis.

In the above embodiment, although an example of obtaining a circuit matrix with respect to a coupled line including two lines and a coupled line including three lines has been described, the interference analysis device according to the present invention may calculate a circuit matrix with respect to a coupled line including at least three lines.

INDUSTRIAL APPLICABILITY

The present invention is useful as an interference analysis device capable of shortening a processing time significantly while maintaining high precision, and can shorten a time taken for wiring design of a circuit board substantially.

The invention claimed is:

1. An interference analysis device for analyzing interference between wires provided on a circuit board and including a coupled line, comprising:
   an input unit that inputs design data representing an arrangement of the wires on the circuit board;
   a selection unit that selects an analysis region that includes at least a part of the circuit board represented by the design data;
   a division unit that divides the wires in the analysis region into segments to be units for calculating a circuit matrix;
   a calculation unit that calculates a circuit matrix with respect to a coupled line constituted by a single segment or a plurality of segments adjacent to each other among the segments divided by the division unit; and
   an analysis unit that obtains a degree of electromagnetic interference between the wires in the analysis region based on the circuit matrix, wherein the calculation unit calculates the circuit matrix of the coupled line, using a parameter set obtained by adding an asymmetry parameter P representing asymmetry of the coupled line to RLGC parameters containing a resistance (R), an inductance (L), a parallel conductance (G), and a capacitance (C) per unit length of a transmission line representing the coupled line.

2. The interference analysis device according to claim 1, wherein the asymmetry parameter P interpolates asymmetry of an asymmetric coupled line to enable the asymmetric coupled line to be dealt with as a symmetric coupled line.

3. The interference analysis device according to claim 1, wherein the asymmetry parameter is used for rotating the circuit matrix mathematically so that an odd mode and an even mode have a symmetric relationship of 1:1 in an asymmetric coupled line.

4. The interference analysis device according to claim 1, wherein the asymmetry parameter P is calculated using an impedance in a case where a line included in the coupled line is present alone.

5. The interference analysis device according to claim 1, wherein the asymmetry parameter P is calculated by the following Expression (1) in a coupled line constituted by a first line and a second line:

$P=$(impedance in a case where the first line is present alone/impedance in a case where the second line is present alone)$^{1/2}$     (1).

6. The interference analysis device according to claim 1, wherein asymmetry parameters P1, P2, and P3 in a coupled line constituted by a first line, a second line, and a third line and having a configuration in which a distance between the first line and the third line is larger than a distance between the other sets of two lines are calculated by the following Expressions (1-a), (1-b), and (1-c), respectively, and the calculation unit calculates a circuit matrix of the coupled line, using P1, P2, and P3 as asymmetry parameters:

$P1=$(impedance in an even mode between the first line and the second line/impedance in an even mode between the third line and the second line)$^{1/2}$    (Expression 1-a)

$P2=$(impedance of the first line in a case where the second line is grounded/impedance of the third line in a case where the second line is grounded)$^{1/2}$    (Expression 1-b)

$P3=$(impedance in an odd mode between the first line and the second line/impedance in an odd mode between the third line and the second line)$^{1/2}$    (Expression 1-c).

7. The interference analysis device according to claim 1, wherein the division unit divides two wires, that are present in the analysis region so as to be adjacent to each other, in such a manner that a position that is a boundary between a portion where the two wires are arranged in parallel and a portion where the two wires are not arranged in parallel is included in a boundary of the segments.

8. The interference analysis device according to claim 1, wherein the circuit matrix is a scattering matrix.

9. The interference analysis device according to claim 1, further comprising a recording unit for storing a plurality of parameter sets obtained respectively by adding an asymmetry parameter representing asymmetry of the coupled line to RLGC parameters containing a resistance (R), an inductance (L), a parallel conductance (G), and a capacitance (C) per unit length of a transmission line in the coupled line, wherein, in the recording unit, the parameter sets are recorded so as to be associated with line information representing configurations of coupled lines regarding the parameter sets, and regarding a coupled line in the analysis region, the calculation unit searches the recording unit for line information matched with the configuration of the coupled line, and calculates a circuit matrix of the coupled line, using a parameter set corresponding to the line information obtained as a result of the search.

10. The interference analysis device according to claim 9, wherein, in a case where the calculation unit is not capable of obtaining the corresponding parameter set as a result of the search, the calculation unit performs interpolation using a parameter set of line information close to a configuration of the coupled line regarding the search, thereby obtaining a parameter set in the coupled line.

11. The interference analysis device according to claim 1, wherein the calculation unit calculates a circuit matrix of a coupled line regarding a plurality of different frequencies, using a parameter set obtained by adding an asymmetry parameter representing asymmetry of the coupled line to RLGC parameters containing a resistance (R), an inductance (L), a parallel conductance (G), and a capacitance (C) per unit length of a transmission line in the coupled line.

12. The interference analysis device according to claim 1, further comprising:

a condition setting unit that sets an interference analysis condition containing an interference amount reference value;

a pair selection unit that selects a pair of wires to be analyzed among wires in the analysis region;

an interference amount calculation unit that calculates an interference amount between the pair of wires based on a connection condition representing a connection relationship between segments included in the pair of wires and the circuit matrix calculated in the calculation unit; and a judgment unit that judges whether or not interference between the pair of wires causes a problem, comparing the interference amount reference value with the interference amount.

13. A recording medium storing data, causing a computer to execute processing of obtaining a circuit matrix of a coupled line, the data comprising:

a parameter set obtained by adding an asymmetry parameter representing asymmetry of the coupled line to RLGC parameters containing a resistance (R), an inductance (L), a parallel conductance (G), and a capacitance (C) per unit length of a transmission line representing the coupled line; and line information representing a configuration of the coupled line, associated with the parameter set.

14. An asymmetric coupled line model, encoded in a computer code to cause a computer to execute processing of calculating a circuit matrix in an asymmetric coupled line included in wires provided in a circuit, the asymmetric coupled line model comprising a parameter set obtained by adding an asymmetry parameter representing asymmetry of the coupled line to RLGC parameters containing a resistance (R), an inductance (L), a parallel conductance (G), and a capacitance (C) per unit length of a transmission line representing the asymmetric coupled line in the circuit, wherein circuit characteristics of the asymmetric coupled line are represented as data readable by the computer, using the parameter set.

15. An interference analysis program causing a computer to execute processing of analyzing interference between wires provided on a circuit board and including a coupled line, the program causing the computer to execute:

input processing of inputting design data that represents an arrangement of wires in the circuit board;

selection processing of selecting an analysis region that includes at least a part of the circuit board represented by the design data;

division processing of dividing the wires in the analysis region into segments to be units for calculating a circuit matrix;

calculation processing of calculating a circuit matrix, regarding a coupled line constituted by a single segment or two or more segments adjacent to each other among the segments obtained in the division processing; and analysis processing of obtaining a degree of electromagnetic interference between the wires in the analysis region based on the circuit matrix, wherein the calculation processing calculates the circuit matrix of the coupled line, using a parameter set obtained by adding an asymmetry parameter representing asymmetry of the coupled line to RLGC parameters containing a resistance (R), an inductance (L), a parallel conductance (G), and a capacitance (C) per unit length of a transmission line representing the coupled line.

16. The interference analysis program according to claim 15, wherein the asymmetry parameter interpolates asymmetry of an asymmetric coupled line to enable the asymmetric coupled line to be dealt with as a symmetric coupled line.

17. The interference analysis program according to claim 15, wherein the asymmetry parameter is used for rotating the circuit matrix mathematically so that an odd mode and an even mode have a 1:1 symmetric relationship in the asymmetric coupled line.

18. The interference analysis program according to claim 15, wherein the asymmetry parameter is calculated using an impedance in a case where a line included in the coupled line is present alone.

* * * * *